United States Patent
Loccufier et al.

(10) Patent No.: US 10,232,658 B2
(45) Date of Patent: *Mar. 19, 2019

(54) LITHOGRAPHIC PRINTING PLATE PRECURSOR INCLUDING (ETHYLENE, VINYL ACETAL) COPOLYMERS

(71) Applicant: AGFA NV, Mortsel (BE)

(72) Inventors: Johan Loccufier, Mortsel (BE); Tim Desmet, Mortsel (BE)

(73) Assignee: AGFA NV, Mortsel (BE)

( * ) Notice: Subject to any disclaimer, the term of this patent is extended or adjusted under 35 U.S.C. 154(b) by 51 days.

This patent is subject to a terminal disclaimer.

(21) Appl. No.: 15/318,681

(22) PCT Filed: Jun. 24, 2015

(86) PCT No.: PCT/EP2015/064194
§ 371 (c)(1),
(2) Date: Dec. 14, 2016

(87) PCT Pub. No.: WO2016/001023
PCT Pub. Date: Jan. 7, 2016

(65) Prior Publication Data
US 2017/0129268 A1    May 11, 2017

(30) Foreign Application Priority Data
Jun. 30, 2014 (EP) .................................... 14174898

(51) Int. Cl.
| G03F 7/032 | (2006.01) |
| B41N 1/08 | (2006.01) |
| B41C 1/10 | (2006.01) |
| G03F 7/039 | (2006.01) |
| C08F 216/06 | (2006.01) |
| G03F 7/16 | (2006.01) |
| G03F 7/20 | (2006.01) |
| G03F 7/30 | (2006.01) |
| G03F 7/038 | (2006.01) |

(52) U.S. Cl.
CPC .............. B41N 1/08 (2013.01); B41C 1/1008 (2013.01); C08F 216/06 (2013.01); G03F 7/032 (2013.01); G03F 7/039 (2013.01); G03F 7/0392 (2013.01); G03F 7/16 (2013.01); G03F 7/20 (2013.01); G03F 7/30 (2013.01); B41C 2210/02 (2013.01); B41C 2210/06 (2013.01); B41C 2210/24 (2013.01); G03F 7/038 (2013.01); G03F 7/0384 (2013.01); G03F 7/0388 (2013.01)

(58) Field of Classification Search
CPC ........................................................ G03F 7/20
See application file for complete search history.

(56) References Cited

U.S. PATENT DOCUMENTS

| 8,048,609 | B2 | 11/2011 | Levanon et al. |
| 8,084,189 | B2 | 12/2011 | Levanon et al. |
| 2010/0047723 | A1 | 2/2010 | Levanon et al. |
| 2011/0059399 | A1 | 3/2011 | Levanon et al. |
| 2017/0088652 | A1* | 3/2017 | Loccufier .............. C08F 216/38 |

FOREIGN PATENT DOCUMENTS

| EP | 1 162 209 A1 | 12/2001 |
| EP | 1 627 732 A1 | 2/2006 |
| WO | 2007/017162 A2 | 2/2007 |
| WO | 2008/103258 A1 | 8/2008 |
| WO | 2009/005582 A1 | 1/2009 |
| WO | 2009/085093 A1 | 7/2009 |
| WO | 2009/099518 A1 | 8/2009 |
| WO | 2010/021704 A1 | 2/2010 |
| WO | 2014/106554 A1 | 7/2014 |

OTHER PUBLICATIONS

Official Communication issued in International Patent Application No. PCT/EP2015/064194, dated Sep. 3, 2015.

* cited by examiner

Primary Examiner — Chanceity N Robinson
(74) Attorney, Agent, or Firm — Keating and Bennett, LLP

(57) ABSTRACT

A positive-working lithographic printing plate includes a support having a hydrophilic surface or a hydrophilic layer, and a heat- and/or light-sensitive coating provided including at least two different (ethylene vinyl) acetal copolymer including a plurality of ethylenic moieties A having a structure according to the following formula:

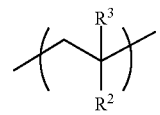

wherein $R^2$ and $R^3$ independently represent hydrogen, a halogen or an optionally substituted linear, branched, or cyclic alk(en)yl group, or an optionally substituted aromatic or heteroaromatic group.

10 Claims, No Drawings

LITHOGRAPHIC PRINTING PLATE PRECURSOR INCLUDING (ETHYLENE, VINYL ACETAL) COPOLYMERS

CROSS REFERENCE TO RELATED APPLICATIONS

This application is a 371 National Stage Application of PCT/EP2015/064194, filed Jun. 24, 2015. This application claims the benefit of European Application No. 14174898.8, filed Jun. 30, 2014, which is incorporated by reference herein in its entirety.

BACKGROUND OF THE INVENTION

1. Field of the Invention

The present invention relates to lithographic printing plate precursors including (ethylene, vinyl acetal) copolymers.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing masters are generally obtained by the image-wise exposure and processing of an imaging material called plate precursor. The coating of the precursor is exposed image-wise to heat or light, typically by means of a digitally modulated exposure device such as a laser, which triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular plate precursors require wet processing since the exposure produces a difference of solubility or of rate of dissolution in a developer between the exposed and the non-exposed areas of the coating. In positive working plates, the exposed areas of the coating dissolve in the developer while the non-exposed areas remain resistant to the developer. In negative working plates, the non-exposed areas of the coating dissolve in the developer while the exposed areas remain resistant to the developer. Most plates contain a hydrophobic coating on a hydrophilic support, so that the areas which remain resistant to the developer define the ink-accepting, printing areas of the plate while the hydrophilic support is revealed by the dissolution of the coating in the developer at the non-printing areas.

Many lithographic printing plates contain polymeric binders such as phenolic resins which can be baked in order to increase the run length on the press. Over the last few years, printing plate materials which provide a high run length without baking have become more popular because the post-bake oven can be eliminated leading to reduced energy consumption and less floor space. The trend towards higher printing speeds on web presses and the use of recycled paper require plate coatings that are characterised by a high abrasion resistance. Unbaked phenolic resins such as novolac, resol or poly(vinyl phenol) have a poor abrasion resistance and cannot provide a high run length in such conditions.

In the prior art, the run length of lithographic printing plates based on phenolic resins has been improved by chemical modification of such binders. Examples thereof are described in for example WO 99/01795, EP 934 822, EP 1 072 432, U.S. Pat. No. 3,929,488, EP 2 102 443, EP 2 102 444, EP 2 102 445 and EP 2 102 446. Phenolic resins have also been mixed with or replaced by other polymers such as poly(vinyl acetal) resins in order to improve the abrasion resistance of the coating. Suitable poly(vinyl acetal) resins are described in U.S. Pat. No. 5,262,270; U.S. Pat. No. 5,169,897; U.S. Pat. No. 5,534,381; U.S. Pat. No. 6,458,511; U.S. Pat. No. 6,270,938; WO 2001/9682; EP 1 162 209; U.S. Pat. No. 6,596,460; U.S. Pat. No. 6,458,503; U.S. Pat. No. 6,783,913; U.S. Pat. No. 6,596,456; WO 2002/73315; WO 2002/96961; WO 2003/79113; WO 2004/20484; EP 1 627 732; WO 2007/17162; WO 2008/103258; WO 2009/5582; WO 2009/85093; US 2009/4599; WO 2009/99518; US 2006/130689; US 2003/166750; U.S. Pat. No. 5,330,877; U.S. Pat. No. 6,358,699; U.S. Pat. No. 6,818,378; WO 2004/081662; US 2005/3296; WO 2007/3030; US 2009/0291387; U.S. Pat. No. 7,544,462; U.S. Pat. No. 8,048,609; U.S. Pat. No. 8,084,189 US 2010/0047723 and US 2011/0059399.

Poly(vinyl acetals) are prepared in the art by acetalisation of poly(vinyl alcohol) with aldehydes. Poly(vinyl acetals) used for lithographic printing plate coatings typically comprise both a hydrophobic acetal moiety, which provides the ink-acceptance, and an hydroxyl substituted aromatic acetal moiety, which produces the solubility differentiation in an alkaline developer upon exposure.

Such poly(vinyl acetals) are typically prepared by the acetalisation of poly(vinyl alcohol) with a mixture of aldehydes, e.g. an aliphatic aldehyde such as butyraldehyde mixed with a phenolic aldehyde such as hydroxybenzaldehyde. The physical and chemical properties of such poly (vinyl acetal) resins are highly dependent on the degree of acetalysation, the ratio of the aliphatic and the aromatic acetal moieties, the stereochemistry and the random or block nature of the acetal resin. Small shifts in process conditions during the preparation of the known acetal resins may produce significant differences in the structure of the obtained resin and thus in significant differences of their properties. For example, incomplete dissolution of the poly (vinyl alcohol) reagent may lead to an irreproducible degree of conversion, i.e. a lack of control of the composition of the final product. Also the competition and the transacetylisation which often occurs between the mixed aldehyde reagents is difficult to control so that the right balance between the hydrophobicity of the resin and its solubility in an alkaline developer cannot always be obtained.

Further important requirements for high quality printing plates are a high sensitivity and a high chemical resistance. A high chemical resistance means that the coating is not or substantially not affected by printing liquids such as ink, e.g. UV curable ink, fountain solution, plate and blanket cleaners and treating liquids for further improving the lithographic properties of the image and non-image areas.

In the unpublished patent application PCT/EP2013/075366 filed on Jan. 1, 2013, (ethylene, vinyl acetal) copolymers and their use in lithographic printing plate precursors are disclosed.

SUMMARY OF THE INVENTION

Preferred embodiments of the present invention provide a printing plate precursor which has both a high abrasian resistance and an improved chemical resistance compared to printing plate precursors of the prior art.

These advantages and benefits are realised by the lithographic printing plate precursor defined below including at least two different (ethylene, vinyl acetal) copolymers of which the hydrophobicity is defined by the presence of ethylenic moieties in their backbone which can be controlled independently from the acetal moieties. As a result, these (ethylene, vinyl acetal) copolymers are intrinsically less susceptible to processing conditions during their preparation and the balance between the ink acceptance, arising from the ethylenic moieties, and the solubility in a developer, arising form the acetal moieties, can be controlled efficiently.

The inventors surprisingly found that combining different (ethylene, vinyl acetal) copolymers as defined in the present invention in the coating of a heat-sensitive printing plate precursor provides to that coating a high sensitivity and abrasion resistance combined with a high chemical resistance against processing and/or treating liquids.

A high chemical resistance means that the coating is not or substantially not affected by printing liquids such as ink, e.g. UV curable ink, fountain solution, plate and blanket cleaners.

Other features, elements, steps, characteristics and advantages of the present invention will become more apparent from the following detailed description of preferred embodiments of the present invention. Specific preferred embodiments of the invention are also defined in the dependent claims.

DETAILED DESCRIPTION OF THE PREFERRED EMBODIMENTS

The lithographic printing plate precursor includes a heat and/or light sensitive coating and is preferably positive-working, i.e. after exposure and development the exposed areas of the coating are removed from the support and define hydrophilic (non-printing) areas, whereas the unexposed coating is not removed from the support and defines oleophilic (printing) areas.

The light and/or heat-sensitive coating which includes the (ethylene, vinyl acetal) copolymers contains one or more layers. The coating may include one, two, three or more layers. Preferably, the coating includes two layers; a first layer, and a second layer located above said first layer. First layer means that the layer is, compared to the second layer, located closer to the lithographic support.

The coating includes at least two different (ethylene, vinyl acetal) copolymers—also referred to herein as poly(vinyl acetal) binders—as defined below. In the preferred embodiment where the coating includes two layers, the at least two different poly(vinyl acetal) binders may independently be present in the first layer, in the second layer or in the first and the second layer.

A first (ethylene, vinyl acetal) copolymer preferably used in the present invention is a copolymer comprising a plurality of ethylenic moieties A and a plurality of acetal moieties B. The term "ethylenic moiety" is generally understood as the monomeric unit—i.e. the building block making up the polymer—obtained after polymerisation of optionally substituted ethylene. The ethylenic moieties comprise —$CH_2$—$CH_2$— as well as mono- and/or di-substituted derivatives thereof.

The first (ethylene, vinyl acetal) copolymer may be a random or a block-copolymer. In the latter preferred embodiment, the copolymer may include alternating sequences of blocks consisting of the ethylenic moieties A and blocks consisting of the acetal moieties B. Such blocks may range from small blocks, e.g. comprising less than 5 moieties—i.e. 1, 2, 3, 4 or 5 moieties—up to blocks comprising 100 moieties or more. Preferably, the blocks including the ethylenic moieties A and blocks including the acetal moieties B independently include about 10 to 90, 15 to 80 or 20 to 60 moieties. The moieties A may be all the same or different. Likewise, the moieties B may be all the same or different.

The acetal moieties B have a structure according to the following formula:

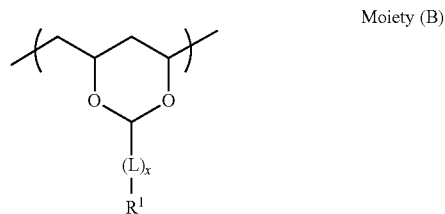

Moiety (B)

wherein

L represents a divalent linking group;

X=0 or 1; and $R^1$ represents an aromatic or heteroaromatic group including at least one hydroxyl group and optionally one or more additional substituent(s). The optional substituents preferably have a Hammett constant $\sigma_p$ below 0.30—i.e. $\sigma_p$ value of the substituents located in para position relative to the hydroxyl group on the phenolic ring. The hydroxyl group(s) may be in ortho, meta and/or para-position on the ring. Suitable examples of the aromatic group include a phenyl, benzyl, tolyl, ortho-meta- or para-xylyl group, naphtyl, anthracenyl, phenanthrenyl group and/or combinations thereof, which may contain, besides the at least one hydroxyl group, further optional substituents. The heteroaromatic group is preferably selected from an optionally substituted furyl, pyridyl, pyrimidyl, pyrazoyl, thiofenyl group and/or combinations thereof, all including at least one hydroxyl group.

In the definition of $R^1$, the optional additional substituents on the aromatic or heteroaromatic group may be selected from additional hydroxy substituents, an alkyl group such as a methyl or ethyl group, an alkoxy group such as a methoxy or an ethoxy group, an aryloxy group, a thioalkyl group, a thioaryl group, —SH, an amino, ethenyl, phenyl, alkenyl, alkynyl, cycloalkyl, aryl, heteroaryl or heteroalicyclic group and/or combinations thereof.

Preferably, $R^1$ is an optionally substituted phenol or naphthol group such as an optionally substituted 2-, 3- or 4-hydroxyphenyl group, a 2,3-, 2,4-, 2,5-dihydroxyphenyl, a 1,2,3-trihydroxyphenyl or a hydroxynaphthyl group. More preferably, $R^1$ is an optionally substituted phenol. The optional substitutents are preferably an alkoxy group such as a methoxy or an ethoxy group.

In a preferred embodiment, $R^1$ represents an aromatic or heteroaromatic group including at least one hydroxyl group without optional additional substituent(s)—such as for example a phenol or naphthol group.

The divalent linking group L is preferably selected from an optionally substituted alkylene, arylene or heteroarylene, —O—, —CO—, —OO—O—, —O—CO—, —CO—NH—, —NH—CO—, —NH—CO—O—, —O—CO—NH—, —NH—CO—NH—, —NH—CS—NH—, —SO—, —SO$_2$—, —CH=N—, —NH—NH— and/or combinations thereof. The substituents optionally present on the alkylene, the arylene or the heteroarylene group may be represented by an alkyl group, a hydroxyl group, an amino group, a (di)alkylamino group, an alkoxy group, a phosponic acid group or a salt thereof. More preferably, the divalent linking group L represents an optionally substituted alkylene, arylene or heteroarylene. Most preferably, L represents —CH$_2$—, —CH$_2$—CH$_2$—, —CH$_2$—CH$_2$—CH$_2$— or a phenylene group.

In a highly preferred embodiment, the acetal moieties B have a structure according to the following formula:

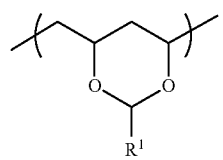

wherein $R^1$ is as defined above.

The ethylenic moieties A have a structure according to the following formula:

Moiety (A)

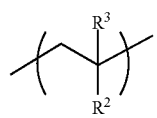

wherein $R^2$ and $R^3$ independently represent hydrogen, a halogen such as chloro, bromo or iodo group, or an optionally substituted linear, branched or cyclic alk(en)yl group—i.e. an alkyl or alkenyl group—or an optionally substituted aromatic group or an optionally substituted heteroaromatic group. Examples of the alkyl group are a methyl, ethyl, n-propyl, n-butyl, n-pentyl, n-hexyl, chloromethyl, trichloromethyl, iso-propyl, iso-butyl, iso-pentyl, neo-pentyl, 1-methylbutyl and iso-hexyl, cyclopropyl, cyclobutyl, cyclopentyl, cyclohexyl and methylcyclohexyl group. Examples of the alkenyl group are ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group. The halogen is preferably a chloro group. The aromatic group is preferably selected from an optionally substituted aryl group such as a phenyl, benzyl, tolyl or an ortho-meta- or para-xylyl group, an optionally substituted naphtyl, anthracenyl, phenanthrenyl, and/or combinations thereof. The heteroaromatic group is preferably selected from an optionally substituted furyl, pyridyl, pyrimidyl, pyrazoyl or thiofenyl group and/or combinations thereof. Preferably, $R^2$ and $R^3$ independently represent hydrogen, a chloro group or a methyl group. In a most preferred embodiment, $R^2$ and $R^3$ represent hydrogen.

In the definition of $R^2$ and $R^3$ the optional substituents on the linear, branched or cyclic alk(en)yl group and on the aromatic or heteroaromatic group may be selected from an alkoxy group such as a methoxy or an ethoxy group, a thioalkyl group, —SH, and/or a combinations thereof. The optional substituents on the aromatic or heteroaromatic group may further be selected from an aryloxy group, a thioaryl group, an azo group such as an azoalkyl or azoaryl group, an amino group and/or a combinations thereof.

In a highly preferred embodiment, the ethylenic moieties A have a structure according to the following formula:

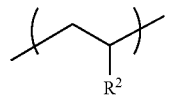

wherein $R^2$ is as defined above.

In the preferred embodiment where the coating includes two layers, the first poly(vinyl acetal) copolymer may be present in the first layer, in the second layer or in the first and the second layer.

Preferably the first (ethylene, vinyl acetal) copolymer comprises ethylenic moieties A as defined above in an amount of at least 10 mol %, preferably in a range from 10 to 55 mol %, more preferably in a range from 15 to 45 mol %, and most preferably in a range from 20 to 35 mol %. The acetal moieties B as defined above are preferably present in an amount of at least 15 mol %, preferably in a range from 15 to 60 mol %, more preferably in a range from 20 to 50 mol %, and most preferably in a range from 25 to 45 mol %. All amounts of the moieties, expressed herein as mol %, refer to the sum of all monomeric units of the copolymer.

In a preferred embodiment, the sum of the amounts of all the moieties A and of all the moieties B in the copolymer ranges from 50 to 90 mol %, more preferably from 60 to 80 mol %, and most preferably from 65 to 75 mol %.

The first (ethylene, vinyl acetal) copolymers preferably used in the present invention may comprise other monomeric units besides moieties A and B as defined above. The copolymer may for example further comprise optionally substituted vinyl alcohol, referred to herein as moieties C, and/or moieties D represented by the following formula:

Moiety (D)

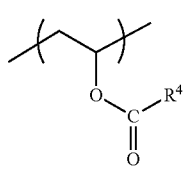

wherein $R^4$ represents hydrogen, or an optionally substituted linear, branched or cyclic alkyl group such as a methyl, ethyl, n-propyl, n-butyl, n-pentyl, n-hexyl, chloromethyl, trichloromethyl, iso-propyl, iso-butyl, iso-pentyl, neo-pentyl, 1-methylbutyl and iso-hexyl cyclopropyl, cyclobutyl, cyclopentyl, methyl cyclohexyl, cyclohexyl group, an optionally substituted aromatic group or an optionally substituted heteroaromatic group. Suitable aromatic and heteroaromatic groups are as defined above for $R^2$ and $R^3$. In a preferred embodiment, $R^4$ is an optionally substituted alkyl group, most preferably methyl.

In the above definition of $R^4$, the optional substituents on the linear, branched or cyclic alkyl group and the aromatic or heteroaromatic group may be selected from an alkoxy group such as a methoxy or an ethoxy group, a thioalkyl group, —SH, and/or a combinations thereof. The optional substituents on the aromatic or heteroaromatic group may further be selected from an aryloxy group, a thioaryl group, an azo group such as an azoalkyl or azoaryl group, an amino group, and/or a combinations thereof.

The amount of vinyl alcohol moieties C is preferably from 10 to 60 mol %, more preferably from 15 to 50 mol %, and most preferably from 20 to 30 mol %. The amount of moieties D is preferably between 0 and 10 mol %. Preferably the amount of moieties D is less than 8 mol %, more preferably less than 3 mol % and most preferably less than 1 mol %. All amounts of the moieties, expressed herein as mol %, refer to the sum of all monomeric units of the copolymer.

The first (ethylene, vinyl acetal) copolymer is preferably represented by the general formula:

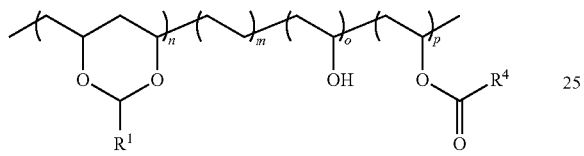

wherein $R^1$ is as defined above and $R^4$ is an optionally substituted alkyl group, preferably methyl;

m=10 to 55 mol %, more preferably 15 to 45 mol %, and most preferably 20 to 35 mol %;

n=15 to 60 mol %, more preferably 20 to 50 mol %, and most preferably 25 to 45 mol %;

o=10 to 60 mol %, more preferably 15 to 50 mol %, and most preferably 20 to 30 mol %; and p=0 to 10 mol %, more preferably less than 3 mol % and most preferably less than 1 mol %.

Without being limited thereto, specific examples of the first (ethylene, vinyl acetal) copolymers used in the present invention are given in the following Table:

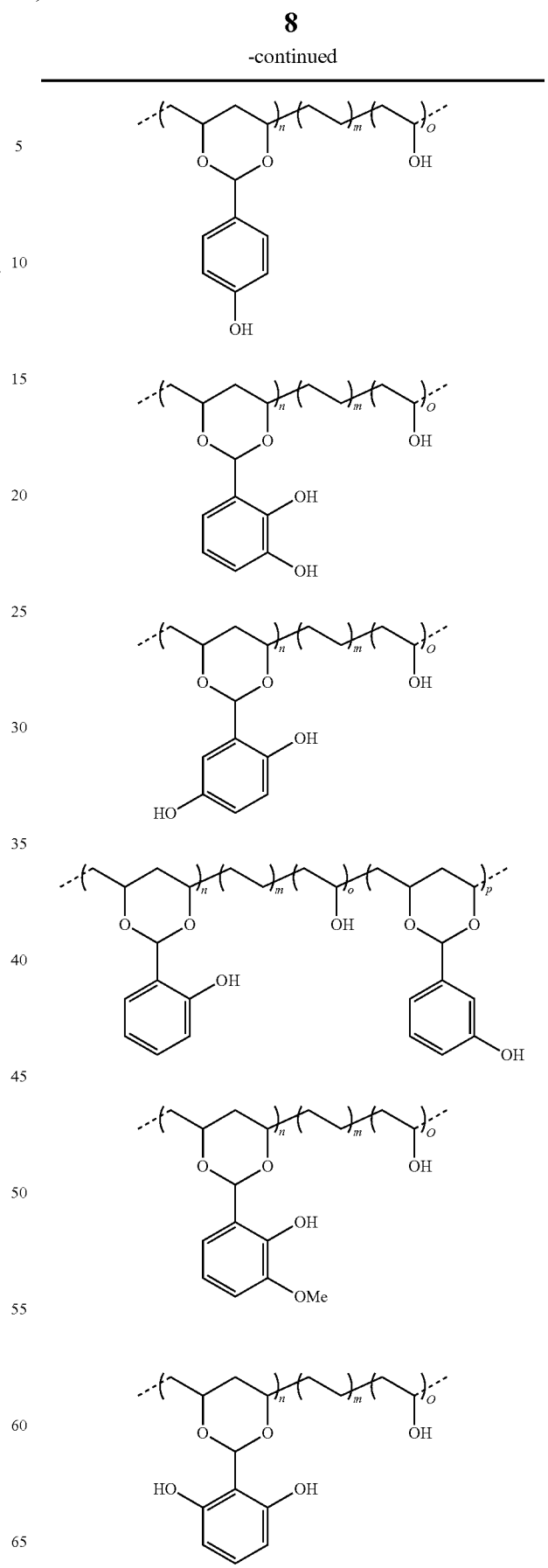

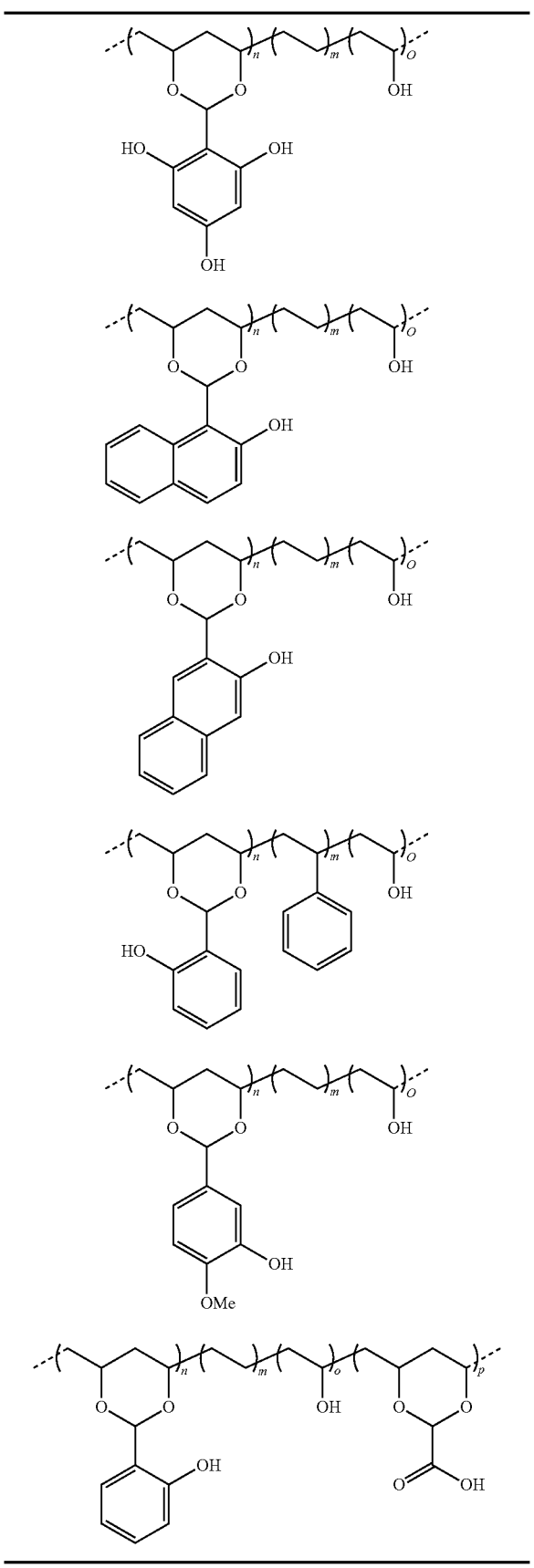

A second poly(vinyl acetal) copolymer preferably used in the present invention is a copolymer comprising a plurality of ethylenic moieties A as defined above, and a plurality of acetal moieties E.

The acetal moieties E have a structure according to the following formula:

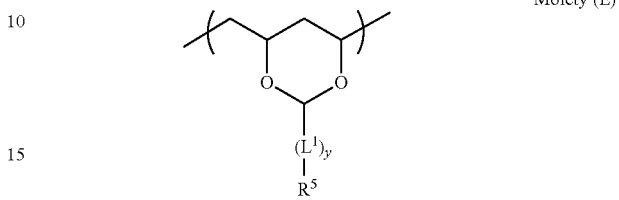

Moiety (E)

wherein
L$^1$ represents a divalent linking group;
y=0 or 1; and
R$^5$ represents an aromatic or heteroaromatic group including at least one hydroxyl group and optionally one or more additional substituent(s), and at least one electron withdrawing group. The hydroxyl group(s) may be in ortho, meta and/or para position on the ring and at least one electron withdrawing group is in ortho or para position relative to the at least one hydroxyl group. Preferably, at least one electron withdrawing group is in para position relative to the at least one hydroxyl group. Most preferably, R$^5$ represents an aromatic or heteroaromatic group including one electron withdrawing group in para position relative to one hydroxyl group.

Suitable examples of the aromatic group include a phenyl, benzyl, tolyl, ortho-meta- or para-xylyl group, naphtyl, anthracenyl, phenanthrenyl group and/or combinations thereof, which may contain, besides the hydroxyl group and the electron withdrawing group further optional substituents. The heteroaromatic group is preferably selected from an optionally substituted furyl, pyridyl, pyrimidyl, pyrazoyl, thiofenyl group and/or combinations thereof, all including at least one hydroxyl group and at least one electron withdrawing group.

The electron withdrawing group is preferably defined in the current invention as a group having a Hammett constant $\sigma_p$ of 0.30 or larger i.e. $\sigma_p$ value of the electron withdrawing substituents located in para position relative to the hydroxyl group on the phenolic ring. More preferably, the Hammett constant $\sigma_p$ is 0.35 or larger, even more preferably the Hammett constant $\sigma_p$ is 0.40 or larger, and most preferably the Hammett constant $\sigma_p$ is 0.45 or larger. Suitable electron withdrawing groups are for example—without being limited thereto—a carboxylic acid, an ester, a ketone, an aldehyde, a nitrile, an alkyl or (hetero)aryl phosphonate, an ammonium salt such as trialkyl ammonium, an alkyl or (hetero)aryl sulphonate, a sulfon, a sulfoxide, a nitro and/or a trihaloalkyl such as a trifluoroalkyl group. In a preferred embodiment, the electron withdrawing group is selected from a nitrile, an ester, a sulfoxide, an aldehyde or a nitro group. In a highly preferred embodiment, the electron withdrawing group is a nitro group.

A selection of $\sigma_p$-values of various substituents is given below (from J. March, Advanced Organic Chemistry, fourth edition, Wiley Interscience, ISBN0-471-60180-2, p. 280 and International Journal of Molecular Sciences, 2005, 6, p. 45-51).

| substituent | $\sigma_p$ |
| --- | --- |
| O⁻ comparative | −0.81 |
| NMe₂ comparative | −0.63 |
| NH₂ comparative | −0.57 |
| OH comparative | −0.38 |
| OMe comparative | −0.28 |
| CMe₃ comparative | −0.15 |
| Me comparative | −0.14 |
| H comparative | 0 |
| Ph comparative | 0.05 |
| COO⁻ comparative | 0.11 |
| F comparative | 0.15 |
| Cl comparative | 0.24 |
| Br comparative | 0.26 |
| I comparative | 0.28 |
| CHO inventive | 0.43 |
| COOH inventive | 0.44 |
| COOR inventive | 0.44 |
| COMe inventive | 0.47 |
| CF₃ inventive | 0.53 |
| NH₃⁺ inventive | 0.6 |
| CN inventive | 0.7 |
| SO₂Me inventive | 0.73 |
| NO₂ inventive | 0.81 |
| N⁺Me₃ inventive | 0.82 |

Further $\sigma_p$-values can be found in Chapman and Shorter, Correlation Analysis in Chemistry, Recent Advances, Plenum, N.Y., 1978, p. 439-540.

In the definition of $R^5$, the optional additional substituents on the aromatic or heteroaromatic group may be selected from additional hydroxy substituents, additional electron withdrawing substituents, an alkyl group such as a methyl or ethyl group, an alkoxy group such as a methoxy or an ethoxy group, an aryloxy group, a thioalkyl group, a thioaryl group, —SH, an amino, ethenyl, phenyl, alkenyl, alkynyl, cycloalkyl, aryl, heteroaryl or heteroalicyclic group and/or combinations thereof.

Preferably, $R^5$ is an optionally substituted phenol or naphthol group such as an optionally substituted 2-, 3- or 4-hydroxyphenyl group, a 2,3-, 2,4-, 2,5-dihydroxyphenyl, a 1,2,3-trihydroxyphenyl or a hydroxynaphthyl group including an electron withdrawing group. More preferably, $R^5$ is an optionally substituted phenol containing one hydroxyl group which includes in the ortho or para position relative to the hydroxyl group an ester, a nitrile, an aldehyde, an alkyl or (hetero)aryl sulfonate, a sulfon, a sulfoxide, a keton, an alkylamido, dialkyl phosphonate and/or a nitro group. Most preferably, $R^5$ is an optionally substituted phenol containing one hydroxyl group which includes in para position an ester, a nitrile, a sulfon, a sulfoxide, an aldehyde or a nitro group. In a highly preferred embodiment, $R^5$ is an optionally substituted phenol containing one hydroxyl group which includes in para position a nitro group.

The divalent linking group $L^1$ is preferably selected from an optionally substituted alkylene, arylene or heteroarylene, —O—, —CO—, —OO—O—, —O—CO—, —CO—NH—, —NH—CO—, —NH—CO—O—, —O—CO—NH—, —NH—CO—NH—, —NH—CS—NH—, —SO—, —SO₂—, —CH=N—, —NH—NH— and/or combinations thereof. The substituents optionally present on the alkylene, the arylene or the heteroarylene group may be represented by an alkyl group, a hydroxyl group, an amino group, a (di)alkylamino group, an alkoxy group, a phosponic acid group or a salt thereof. More preferably, the divalent linking group $L^1$ represents an optionally substituted alkylene, arylene or heteroarylene. Most preferably, $L^1$ represents —CH₂—, —CH₂—CH₂—, —CH₂—CH₂—CH₂— or a phenylene group.

In a highly preferred embodiment, the acetal moieties E have a structure according to the following formula:

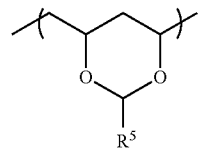

wherein $R^5$ is as defined above.

In the preferred embodiment where the coating includes two layers, the second poly(vinyl acetal) copolymer may be present in the first layer, in the second layer or in the first and the second layer. Preferably the second poly(vinyl acetal) copolymer is present in the first layer and the first poly(vinyl acetal) copolymer as defined above is present in the second layer.

Preferably the second (ethylene, vinyl acetal) copolymer comprises ethylenic moieties A as defined above in an amount of at least 10 mol %, preferably in a range from 10 to 55 mol %, more preferably in a range from 15 to 45 mol %, and most preferably in a range from 20 to 35 mol %. The acetal moieties E as defined above are preferably present in an amount of at least 15 mol %, preferably in a range from 15 to 60 mol %, more preferably in a range from 20 to 50 mol %, and most preferably in a range from 25 to 45 mol %. All amounts of the moieties, expressed herein as mol %, refer to the sum of all monomeric units of the copolymer.

In a preferred embodiment, the sum of the amounts of all the moieties A and of all the moieties E in the copolymer ranges from 50 to 90 mol %, more preferably from 60 to 80 mol %, and most preferably from 65 to 75 mol %.

The second (ethylene, vinyl acetal) copolymers preferably may comprise other monomeric units besides moieties A and E as defined above. The copolymer may for example further comprise optionally substituted vinyl alcohol moieties C and/or moieties D, as described above. The amount of vinyl alcohol moieties C is preferably from 10 to 60 mol %, more preferably from 15 to 50 mol %, and most preferably from 20 to 30 mol %. The amount of moieties D is preferably between 0 and 10 mol %. Preferably the amount of moieties D is less than 8 mol %, more preferably less than 3 mol % and most preferably less than 1 mol %.

The second (ethylene, vinyl acetal) copolymer is preferably represented by the general formula:

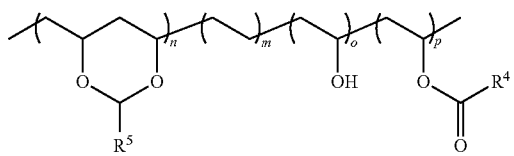

wherein $R^4$ and $R^5$ are as defined above;
m=10 to 55 mol %, more preferably 15 to 45 mol %, and most preferably 20 to 35 mol %;
n=15 to 60 mol %, more preferably 20 to 50 mol %, and most preferably 25 to 45 mol %;
o=10 to 60 mol %, more preferably 15 to 50 mol %, and most preferably 20 to 30 mol %; and
p=0 to 10 mol %, more preferably less than 3 mol % and most preferably less than 1 mol %.

Without being limited thereto, specific examples of the second (ethylene, vinyl acetal) copolymers are given in the following Table:

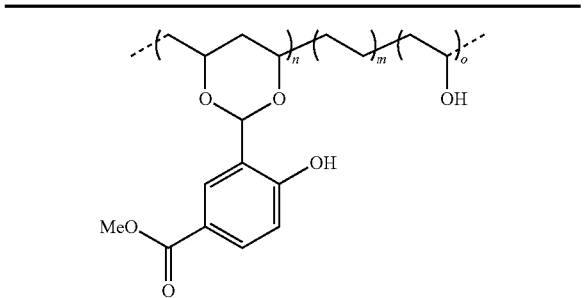

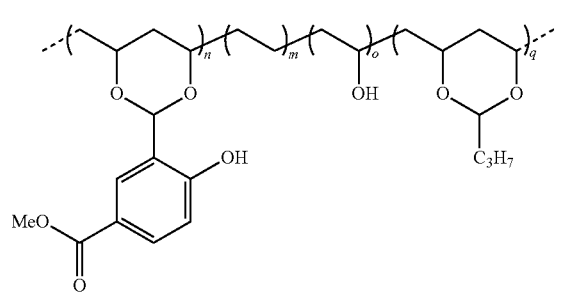

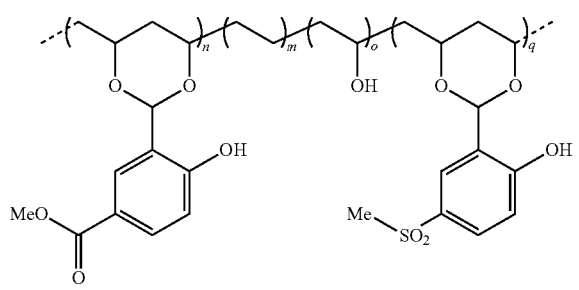

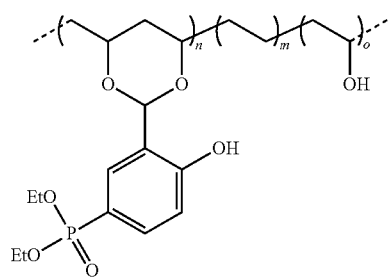

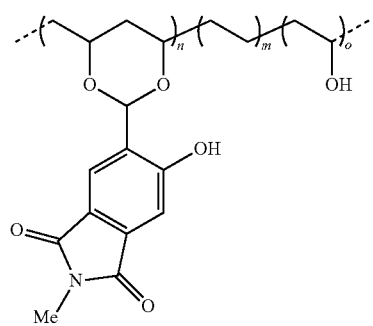

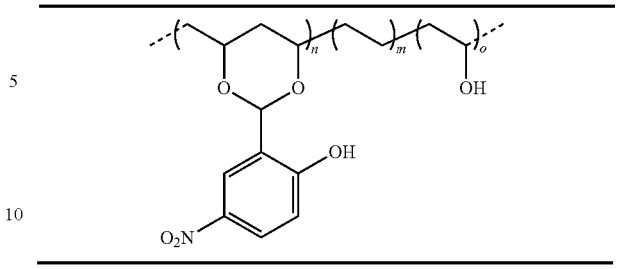

wherein n, m, o and p = are as defined above.

A third (ethylene, vinyl acetal) copolymer preferably comprises acetal moieties A and B as defined above, and a plurality of acetal moieties F and/or moieties G which are different from the acetal moiety B and which include at least one nitrogen atom.

The acetal moieties F and/or moieties G preferably have a structure according to the following formulae:

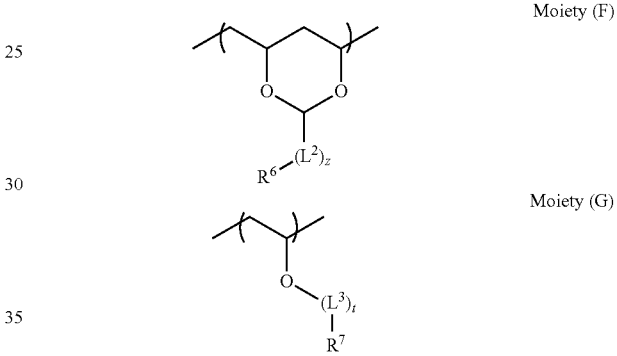

wherein
- $L^2$ and $L^3$ represent a linking group;
- z and t independently represent 0 or 1;
- $R^6$ and $R^7$ independently represent an optionally substituted alkyl group, or an optionally substituted aromatic or heteroaromatic group;
- with the proviso that in moiety F at least one of $R^6$ or $L^2$ includes a nitrogen atom, and in moiety G at least one of $R^7$ or $L^3$ includes a nitrogen atom.

Suitable aromatic or heteroaromatic groups are as defined above for $R^2$ or $R^3$. Preferably, $R^6$ and $R^7$ independently represent an optionally substituted phenyl or alkyl group. In the definition of $R^6$ and $R^7$ the optional substituents on the alkyl, aromatic or heteroaromatic groups may independently represent an alkyl group, a thioalkyl group, a hydroxy group, a cyano group, a nitro group, an ester, an amide group, —SH, a halogen such as a chloro, bromo or iodo group, or a group including —CO—NH—, —NH—CO—O—, —NH—CO—NH—, —NH—CS—NH—, —CO—NH—SO$_2$—, —NH—SO$_2$—. Preferably, the optional substituents independently represent a group including —CO—NH—, —NH—CO—O—, —NH—CO—NH—, —NH—CS—NH—, —CO—NH—SO$_2$— or —NH—SO$_2$—. Most preferably the optional substituents represent —CO—NH$_2$, —O—CO—NH$_2$, —SO$_2$—NH$_2$, —NH—CO—NH$_2$ or —NH—CS—NH$_2$.

In a preferred embodiment $R^6$ and $R^7$ independently represent an alkyl, an aromatic or heteroaromatic group substituted with a group including —CO—NH—, —NH—

—CO—O—, —NH—CO—NH—, —NH—CS—NH—, —CO—NH—SO$_2$— or —NH—SO$_2$—.

The linking groups L$^2$ and L$^3$ preferably independently include an optionally substituted alkylene such as a methylene, ethylene or propylene group, an optionally substituted arylene or heteroarylene group, —O—, —OO—O—, —CO—NH—, —NH—CO—O—, —NH—CO—S—, —CO—NH—CO—, —NH—CO—NH—, —NH—CS—NH—, —CO—NH—SO$_2$—, —CO—NR'—, —SO—, —SO$_2$—, —NR"—SO$_2$—, —P(=O)(—O—R''')—O—, —CH=N—, —NH—NH—, —S—, —S—S—, a maleimido group and/or combinations thereof, wherein R', R", R''' independently represent hydrogen or an optionally substituted alkyl, aryl, or heteroaryl group. More preferably, the linking groups L$^2$ and L$^3$ independently include an alkylene group, —CO—NH—, —NH—CO—O—, —NH—CO—NH—, —NH—CS—NH—, —CO—NH—SO$_2$—, —NH—SO$_2$—, and/or combinations thereof. Most preferably, the linking groups L$^2$ and L$^3$ independently include an alkylene group, —CO—NH—, —CO—NH—SO$_2$— or —NH—SO$_2$—, and/or combinations thereof. Alternatively, the linking groups L$^2$ or L$^3$ independently represent an alkylene group.

In a preferred embodiment, the acetal moiety F has a structure according to the following formula:

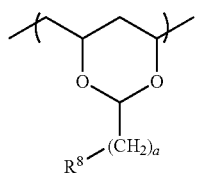

wherein a=1, 2 or 3; and

R$^8$ represents an alkyl, aromatic or heteroaromatic group including at least one substituent selected from —CO—NH—, —NH—CO—O—, —NH—CO—NH—, —CO—NH—SO$_2$— or —NH—SO$_2$—. More preferably the at least one substituent represents —CO—NH$_2$, —O—CO—NH$_2$, —CO—NH—SO$_2$—, —SO$_2$—NH$_2$, —NH—CO—NH$_2$ or —NH—CS—NH$_2$. Most preferably the at least one substituent represents —CO—NH$_2$, —CO—NH—SO$_2$— or —SO$_2$—NH$_2$.

More preferably, R$^8$ in the acetal moiety F represents a (hetero)aryl amide, (hetero)aryl sulphonamide or a (hetero) aryl acylsulphonamide.

Most preferrably, the acetal moiety F has a structure according to the following formula:

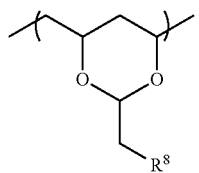

wherein R$^8$ represents a (hetero)aryl amide, (hetero)aryl sulphonamide or a (hetero)aryl acylsulphonamide.

In the preferred embodiment where the coating includes two layers, the third poly(vinyl acetal) copolymer may be present in the first layer, in the second layer or in the first and the second layer. Preferably the third poly(vinyl acetal) copolymer is present in the first layer and the first poly(vinyl acetal) copolymer as defined above is present in the second layer. More preferably, the second poly(vinyl acetal) copolymer as defined above and the third poly(vinyl acetal) copolymer are present in the first layer and the first poly (vinyl acetal) copolymer as defined above is present in the second layer.

In a preferred embodiment, the sum of the amounts of all the moieties A, and of all the moieties B and of all the moieties F and/or moieties G in the third copolymer ranges from 50 to 90 mol %, more preferably from 60 to 80 mol %, and most preferably from 65 to 75 mol %. Preferably, the third (ethylene, vinyl acetal) copolymer preferably used in the present invention comprises the moieties A, B and F.

The third (ethylene, vinyl acetal) copolymers preferably used in the present invention may comprise other monomeric units besides moieties A, B, F and/or G as defined above. The copolymer may for example further comprise acetal moieties E, optionally substituted vinyl alcohol moieties C and/or moieties D, as described above. The amount of vinyl alcohol moieties C is preferably from 10 to 60 mol %, more preferably from 15 to 50 mol %, and most preferably from 20 to 30 mol %. The amount of moieties D is preferably between 0 and 10 mol %. Preferably the amount of moieties D is less than 8 mol %, more preferably less than 3 mol % and most preferably less than 1 mol %.

The third (ethylene, vinyl acetal) copolymer is preferably represented by the general formula:

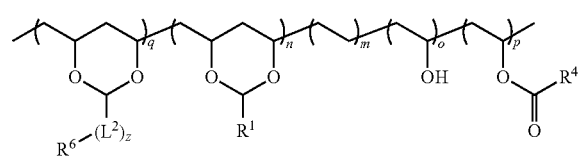

wherein R$^1$, R$^4$, R$^6$, L$^2$ and z are as defined above;

m=10 to 55 mol %, more preferably 15 to 45 mol %, and most preferably 20 to 35 mol %;

n=15 to 60 mol %, more preferably 20 to 50 mol %, and most preferably 25 to 45 mol %;

o=10 to 60 mol %, more preferably 15 to 50 mol %, and most preferably 20 to 30 mol %;

p=0 to 10 mol %, more preferably less than 3 mol % and most preferably less than 1 mol %; and q=3 to 40 mol %, more preferably 5 to 35 mol %, and most preferably 7 to 30 mol %.

Without being limited thereto, specific examples of the third (ethylene, vinyl acetal) copolymers used in the present invention are given in the following Table:

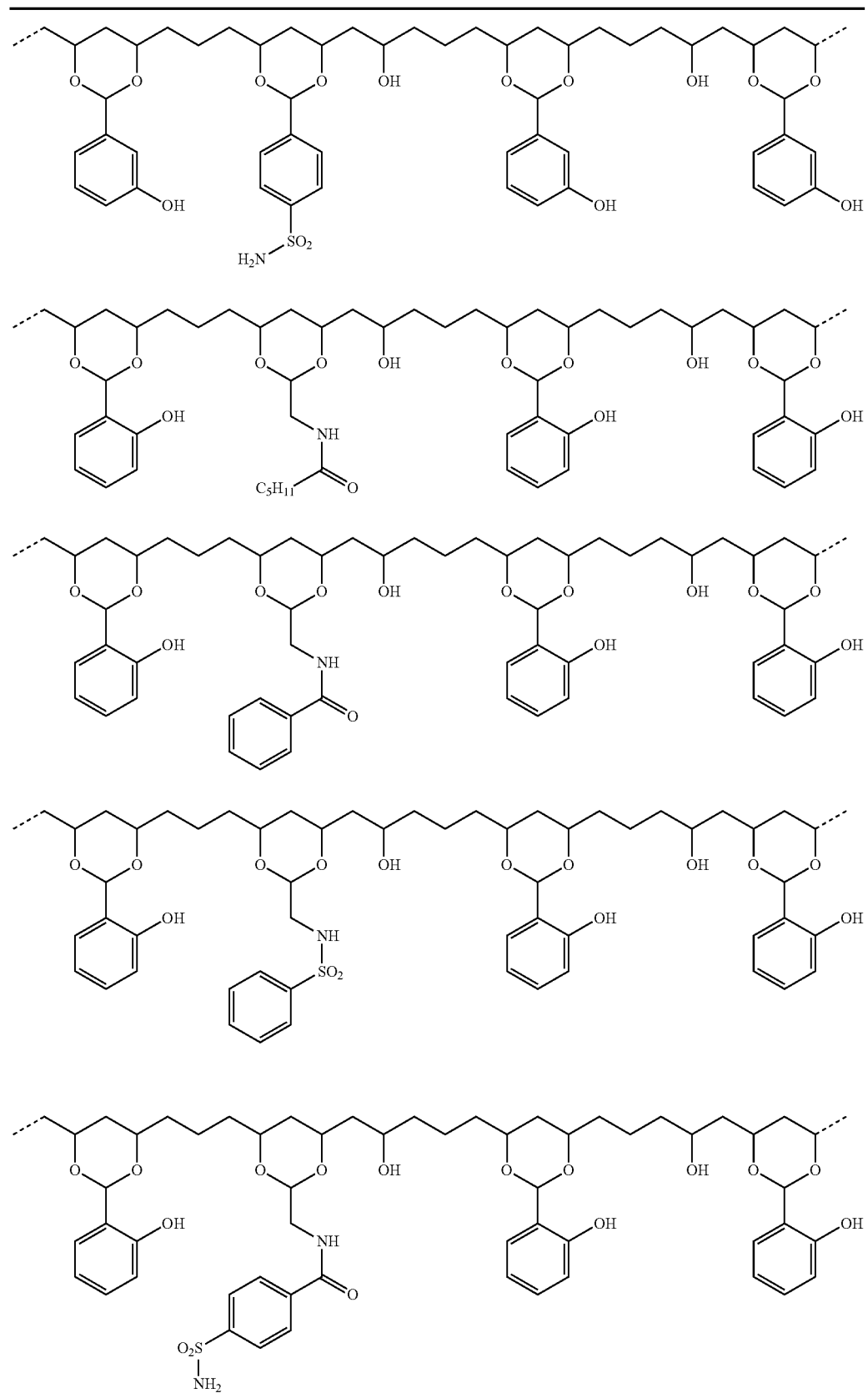

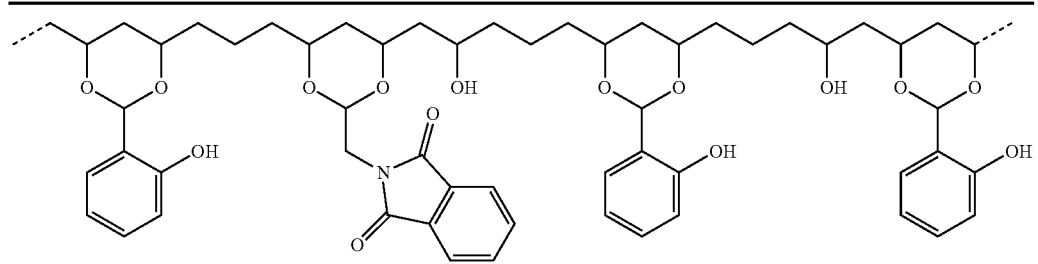
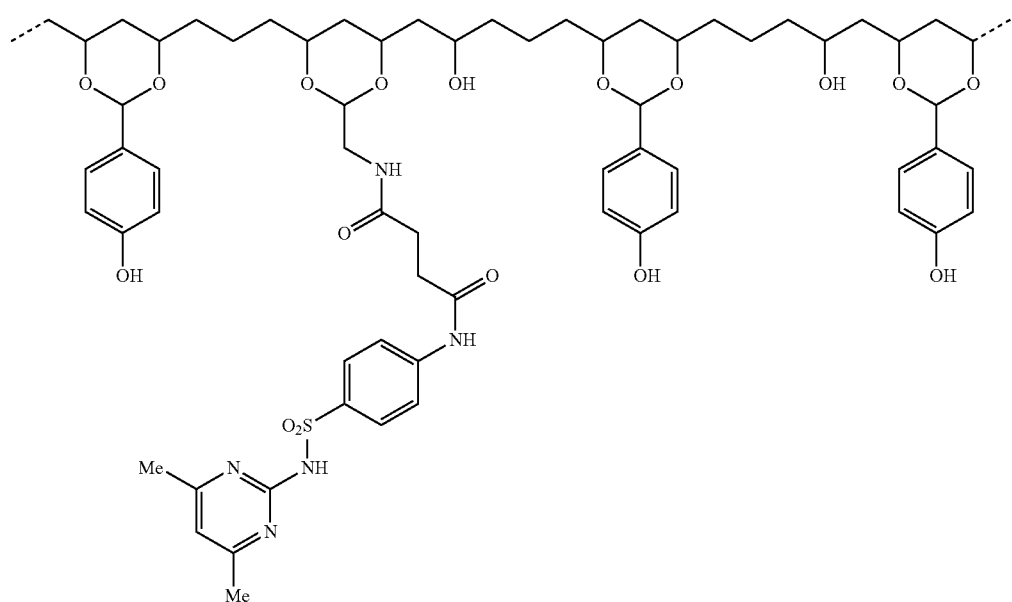
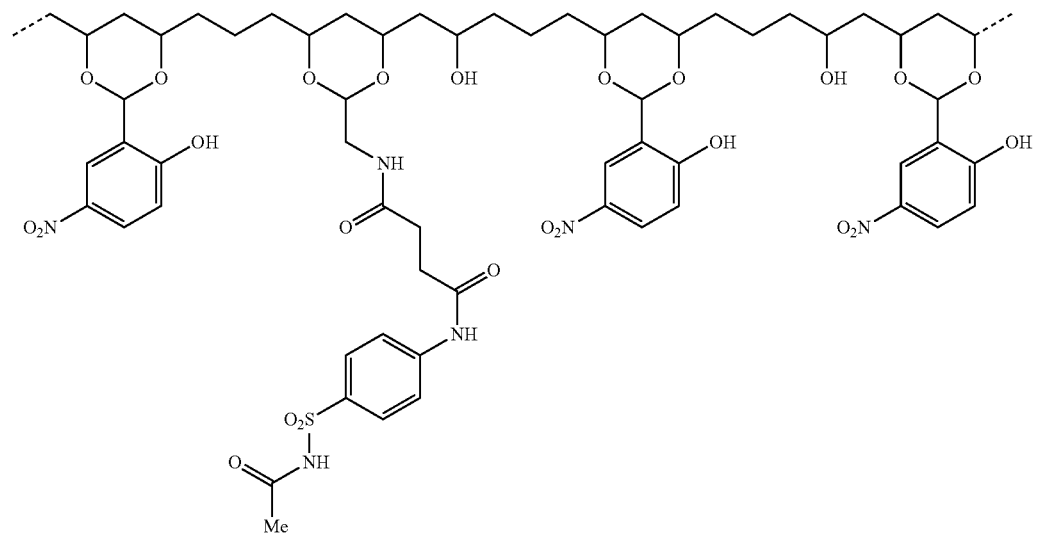

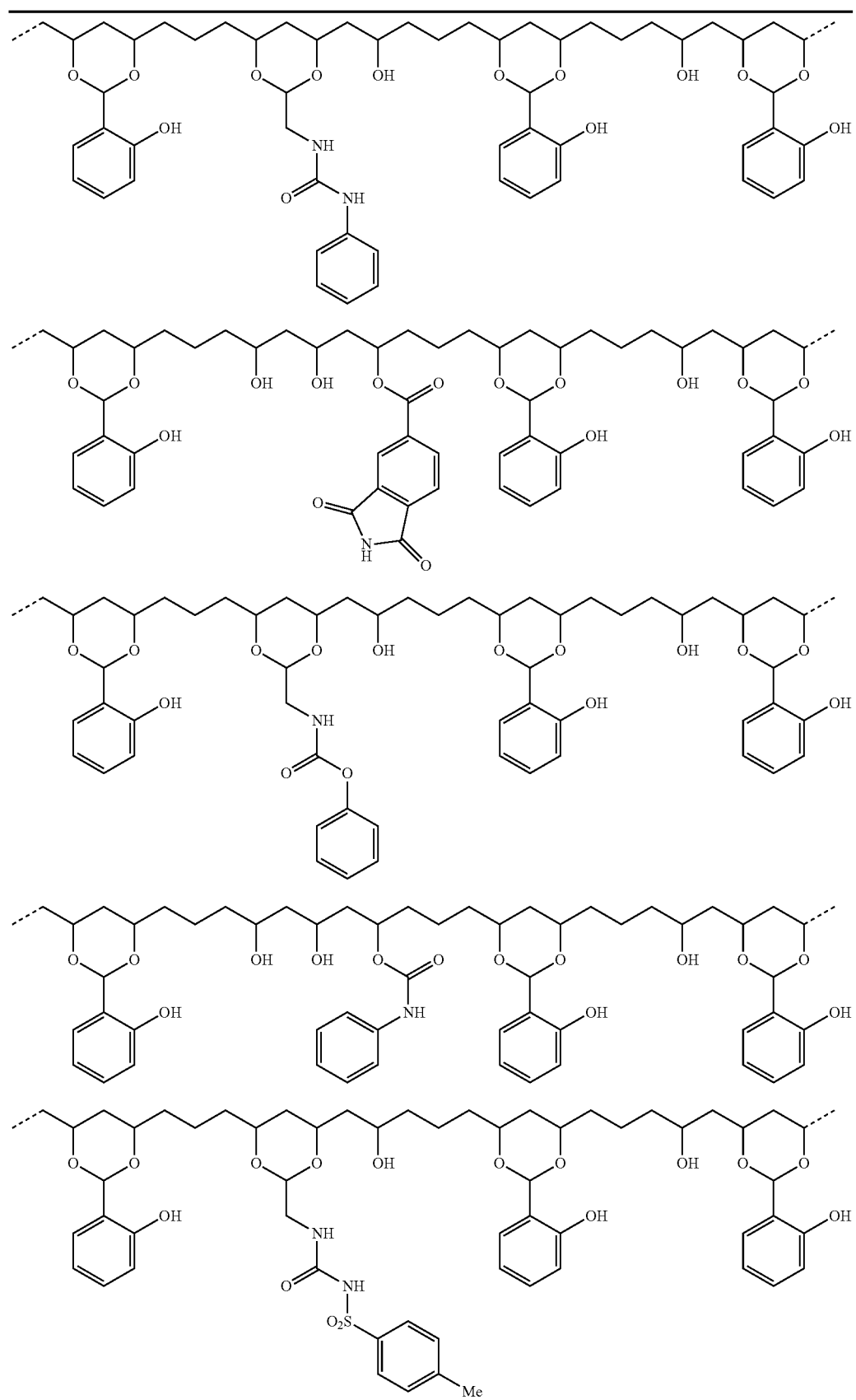

-continued
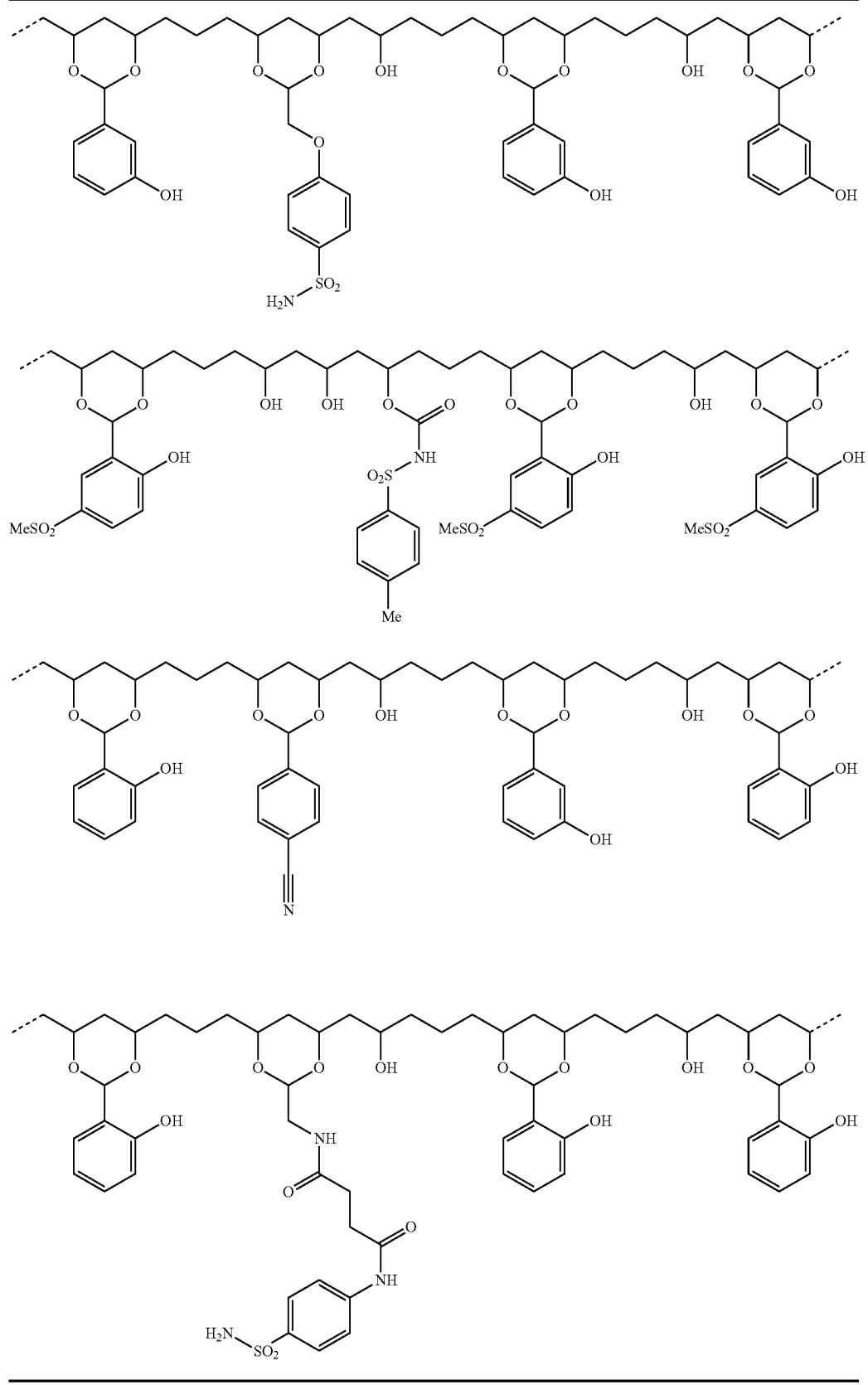

A fourth (ethylene, vinyl acetal) copolymer preferably comprises a plurality of acetal moieties A and B as defined above, and a plurality of acetal moieties H and/or moieties I which include a structural moiety comprising a chromophoric group that has its main absorption in the infrared region.

Preferably the acetal moieties H and the moieties I have a structure according to the following formulae:

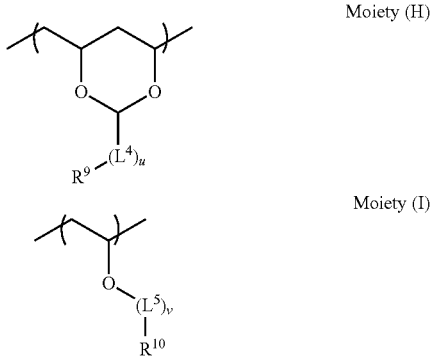

Moiety (H)

Moiety (I)

wherein
$L^4$ and $L^5$ represent a divalent linking group;
u and v independently represent 0 or 1;
$R^9$ and $R^{10}$ include a structural moiety comprising a chromophoric group that has its main absorption in the infrared region.

The linking groups $L^4$ and $L^5$ independently represent a linking group as defined above for the linking group $L^1$.

In a preferred embodiment of the present invention, the acetal moieties H have a structure according to the following formula:

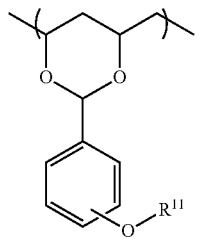

wherein
$R^{11}$ represents a structural moiety comprising a chromophoric group that has its main absorption in the infrared region and the bond to the center of the aromatic ring means that any of the hydrogen atoms of the aromatic ring can be substituted by —O—$R^{11}$:—O$R^{11}$ may be in ortho, meta or para position on the ring structure.

The chromophoric group has its main absorption in the infrared region, i.e. radiation having a wavelength in the range from 750 to 1500 nm, preferably in the range from 750 nm to 1250 nm, more preferably in the range from 750 nm to 1100 nm, and most preferably in the range from 780 nm to 900 nm. Preferably the chromophoric group has its absorption maximum in the infrared region. Preferably, the term "chromophoric moiety" corresponds to a group including a conjugated system.

Useful chromophoric groups correspond to the dyes given in The Chemistry and Application of Dyes, edited by D. R. Waring and G. Hallas (Plenum Press New York and London, 1990). Suitable dye classes can be selected from the group consisting of indoaniline dyes, azomethine dyes, azo dyes, di- and triaryl carbonium dyes and their heteroatomic counterparts, anthraquinone dyes, benzodifuranone dyes, polycyclic aromatic carbonyl dyes, indigoid dyes, cyanines, oxonoles, hemicyanines, azacarbocyanines, merocyanines, hemicyanines, carbostyryl dyes, phthalocyanines, quinophtalones, nitro and nitroso dyes, formazan dyes and stylbene dyes. The dyes can also be complexes of transition metals, typically e.g. copper or iron complexes. Most preferably, the chromophoric moiety is derived from cyanine dyes, indoaniline dyes, azomethine dyes, azo dyes or anthraquinone dyes.

The chromophoric group preferably has a structure according to General Formula I:

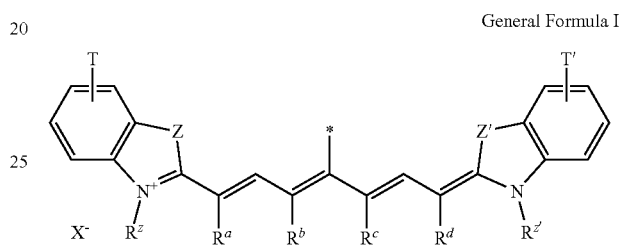

General Formula I wherein
T and T' independently represent one or more substituents or an annulated ring;
Z and Z' independently represent —O—, —S—, —$CR^eR^f$— or —CH=CH— and wherein $R^e$ and $R^f$ independently represent an optionally substituted alkyl or aryl group;
$R^z$ and $R^{z'}$ independently represent an optionally substituted alkyl group;
$R^b$ and $R^c$ independently represent a hydrogen atom or an optionally substituted alkyl group or represent the necessary atoms to form an optionally substituted ring structure;
$R^a$ and $R^d$ independently represent a hydrogen atom or an optionally substituted alkyl group;
$R^z$ and $R^a$ or $R^d$ and $R^{z'}$ may represent the necessary atoms to form an optionally substituted 5- or 6-membered ring;
$X^-$ renders the chromophoric group neutral; and
* denotes the linking position.

In a preferred embodiment, Z and Z' represent —$CR^eR^f$— wherein $R^e$ and $R^f$ represent an alkyl group, preferably a methyl group; $R^a$ and $R^d$ represent a hydrogen atom; and $R^b$ and $R^c$ represent the necessary atoms to form an optionally substituted ring structure; preferably a five or six membered carbocyclic or aromatic ring, most preferably a six membered carbocyclic ring.

Preferably $X^-$ represents a halide anion, i.e. $Cl^-$, $Br^-$ or $I^-$; a sulfonate group anion, e.g. $CH_3SO_3^-$, $CF_3SO_3^-$, p-toluene sulfonate; a tetrafluoroborate or a hexafluorophosphate anion. Most preferably, $X^-$ represents p-toluene sulfonate.

The one or more substituents T and T' may be independently selected from halogen such as a chloro, bromo or iodo atom, an optionally substituted alkyl group, an optionally substituted (hetero)alkyl group, an alkoxy group, a cyano group, —$CO_2R^t$, —$CF_3$ and —$SO_2R^n$ and wherein $R^t$ represents a hydrogen atom or an optionally substituted alkyl group and $R^n$ respresents an optionally substituted alkyl or an optionally substituted (hetero)aryl group.

The chromophoric group according to general formula I is preferably cationic meaning that none of the substituents contain an anionic group.

In a preferred embodiment, the weight ratio of the weight of the chromophoric group in the polymer to the total weight of the polymer is less than 25 wt %, preferably less than 15% wt, more preferably less then 10 wt % and most preferably between 2 and 7.5 wt %.

The acetal moiety H is preferably prepared by post-modification of an acetal moiety bearing at least one hydroxy substituted group. Preferably, the acetal moiety H is prepared by acylation, acetalysation or alkylation of such an acetal precursor moiety—i.e. an acetal moiety bearing at least one hydroxy substituted group. An alkylation reaction of such an acetal precursor moiety is particularly preferred. For example, the acetal moiety H can be prepared by reacting a chromophoric group according to General Formula II including a leaving group in the meso-position, preferably a chloride leaving group, with a hydroxy group on the acetal precursor moiety.

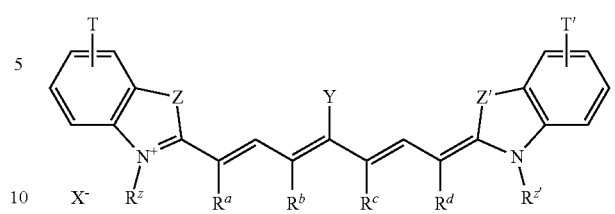

General Formula II wherein Y represents a leaving group and all the other substituents are as defined in General Formula I.

The leaving group Y preferably represents a halogen such as a fluorine, chlorine, bromine or iodine, more preferably chlorine or iodine and most preferably a chlorine.

Typical examples of resins including acetal moieties bearing hydroxy substituted groups suitably used for the preparation of acetal moieties H, are given below without being limited thereto. The polymers are represented by their main structural elements, independent from the monomer ratios.

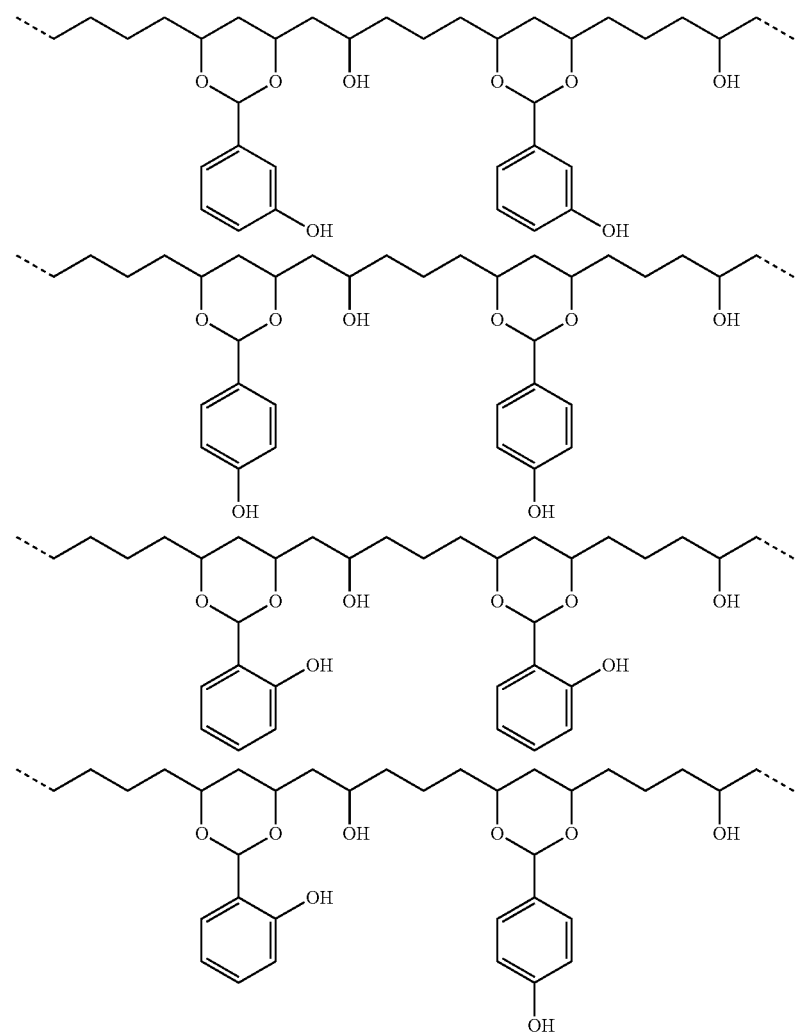

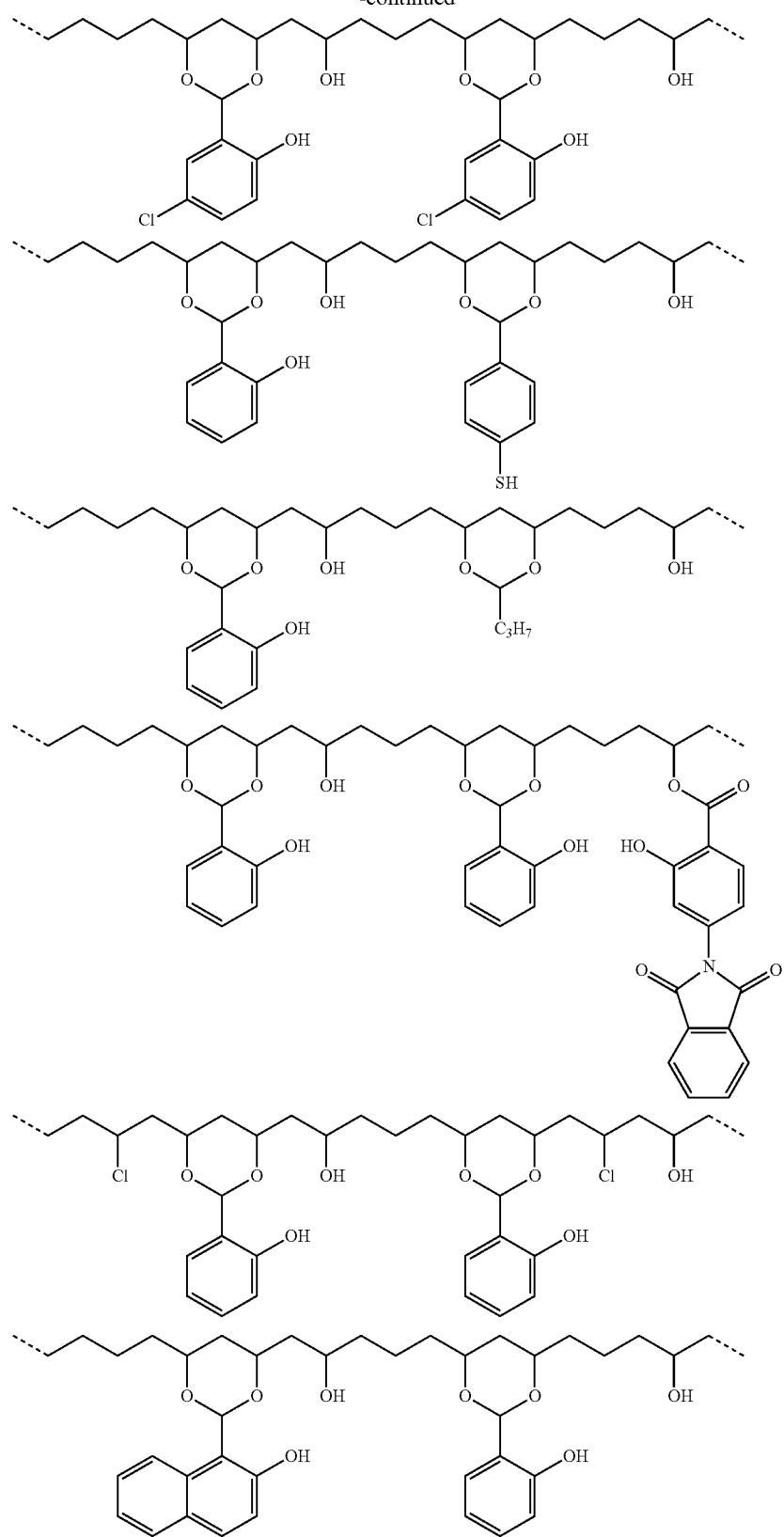

Typical examples of chromophoric groups according to General Formula II including a leaving group in the meso-position, suitably used as precursors in the preparation of the resins are given in the Table below without being limited thereto.

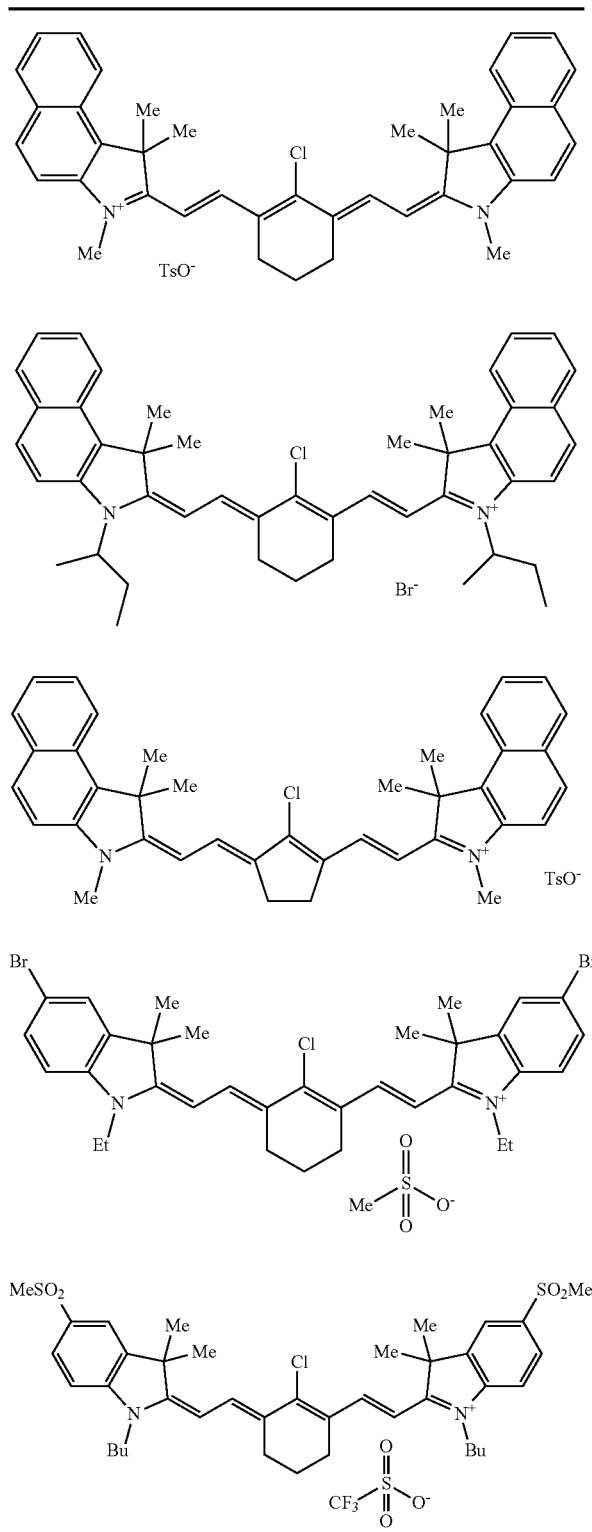

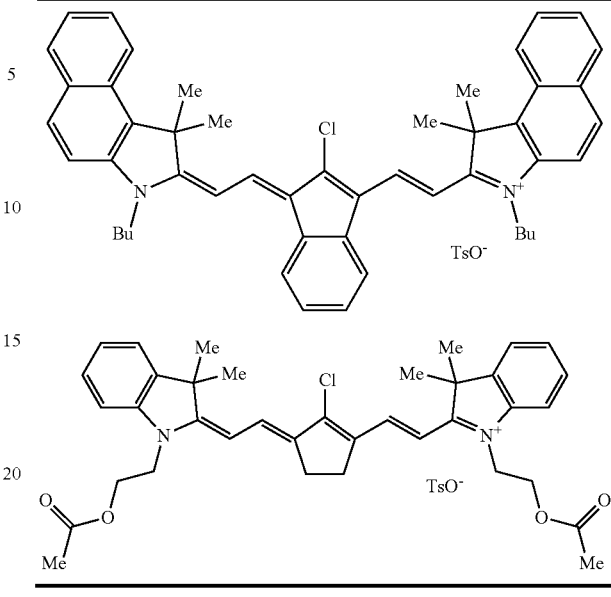

In the preferred embodiment where the coating includes two layers, the third poly(vinyl acetal) copolymer may be present in the first layer, in the second layer or in the first and the second layer.

Preferably the fourth (ethylene, vinyl acetal) copolymer comprises ethylenic moieties A as defined above in an amount of at least 10 mol %, preferably in a range from 10 to 55 mol %, more preferably in a range from 15 to 45 mol %, and most preferably in a range from 20 to 35 mol %. The acetal moieties B as defined above are preferably present in an amount of at least 15 mol %, preferably in a range from 15 to 60 mol %, more preferably in a range from 20 to 50 mol %, and most preferably in a range from 25 to 45 mol %. The acetal moieties H as defined above, if present, are preferably present in an amount of at least 0.25 mol %, preferably in a range from 0.25 to 25 mol %, more preferably in a range from 0.5 to 20 mol %, and most preferably in a range from 1 to 15 mol %. The acetal moieties I as defined above are, if present, preferably present in an amount of at least 0.25 mol %, preferably in a range from 0.25 to 25 mol %, more preferably in a range from 0.5 to 20 mol %, and most preferably in a range from 1 to 15 mol %. All amounts of the moieties, expressed herein as mol %, refer to the sum of all monomeric units of the copolymer.

In a preferred embodiment, the sum of the amounts of all the moieties A, and of all the moieties B and of all the moieties H and/or moieties I in the copolymer ranges from 50 to 90 mol %, more preferably from 60 to 80 mol %, and most preferably from 65 to 75 mol %. Preferably, the (ethylene, vinyl acetal) copolymer comprises the moieties A, B and H.

The fourth (ethylene, vinyl acetal) copolymers preferably may comprise other monomeric units besides moieties A and B as defined above. The copolymer may for example further comprise acetal moieties E, acetal moieties F or moieties G, optionally substituted vinyl alcohol moieties C and/or moieties D, as described above. The amount of vinyl alcohol moieties E is preferably from 10 to 60 mol %, more preferably from 15 to 50 mol %, and most preferably from 20 to 30 mol %. The amount of moieties F is preferably between 0 and 10 mol %. Preferably the amount of moieties F is less than 8 mol %, more preferably less than 3 mol % and most preferably less than 1 mol %.

The fourth (ethylene, vinyl acetal) copolymer is preferably represented by the general formula:

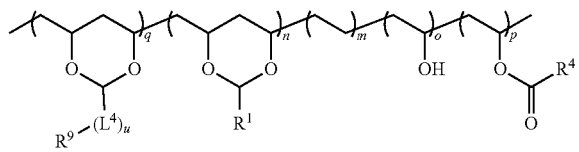

wherein $R^1$, $R^4$, $R^9$, u and $L^4$ are as defined above;

m=10 to 55 mol %, more preferably 15 to 45 mol %, and most preferably 20 to 35 mol %;

n=15 to 60 mol %, more preferably 20 to 50 mol %, and most preferably 25 to 45 mol %;

o=10 to 60 mol %, more preferably 15 to 50 mol %, and most preferably 20 to 30 mol %; and p=0 to 10 mol %, more preferably less than 3 mol % and most preferably less than 1 mol %;

q=0.25 to 25 mol %, more preferably 0.5 to 20 mol %, and most preferably 1 to 15 mol %.

Without being limited thereto, specific examples of the fourth (ethylene, vinyl acetal) copolymers according to the present invention are given in the following Table:

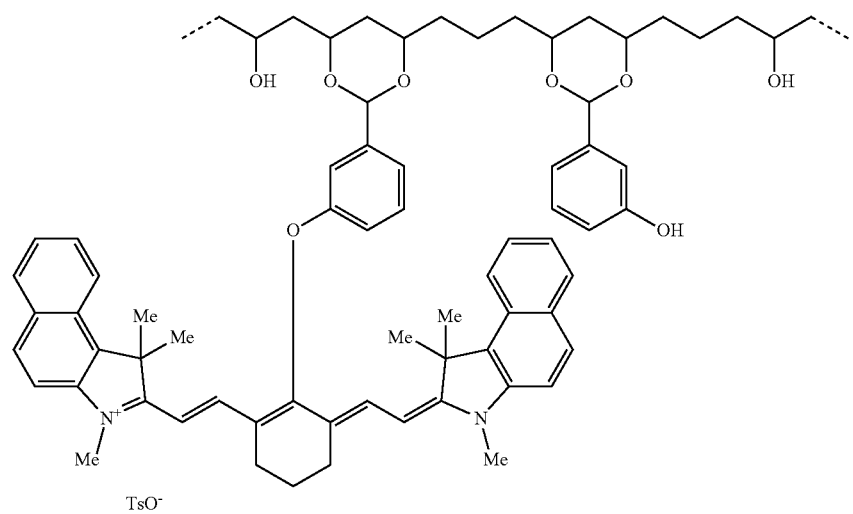

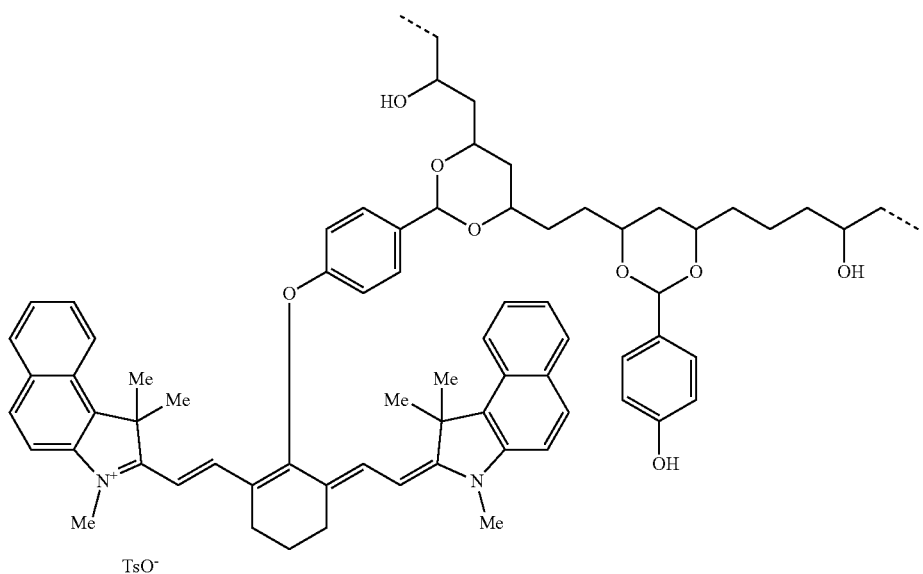

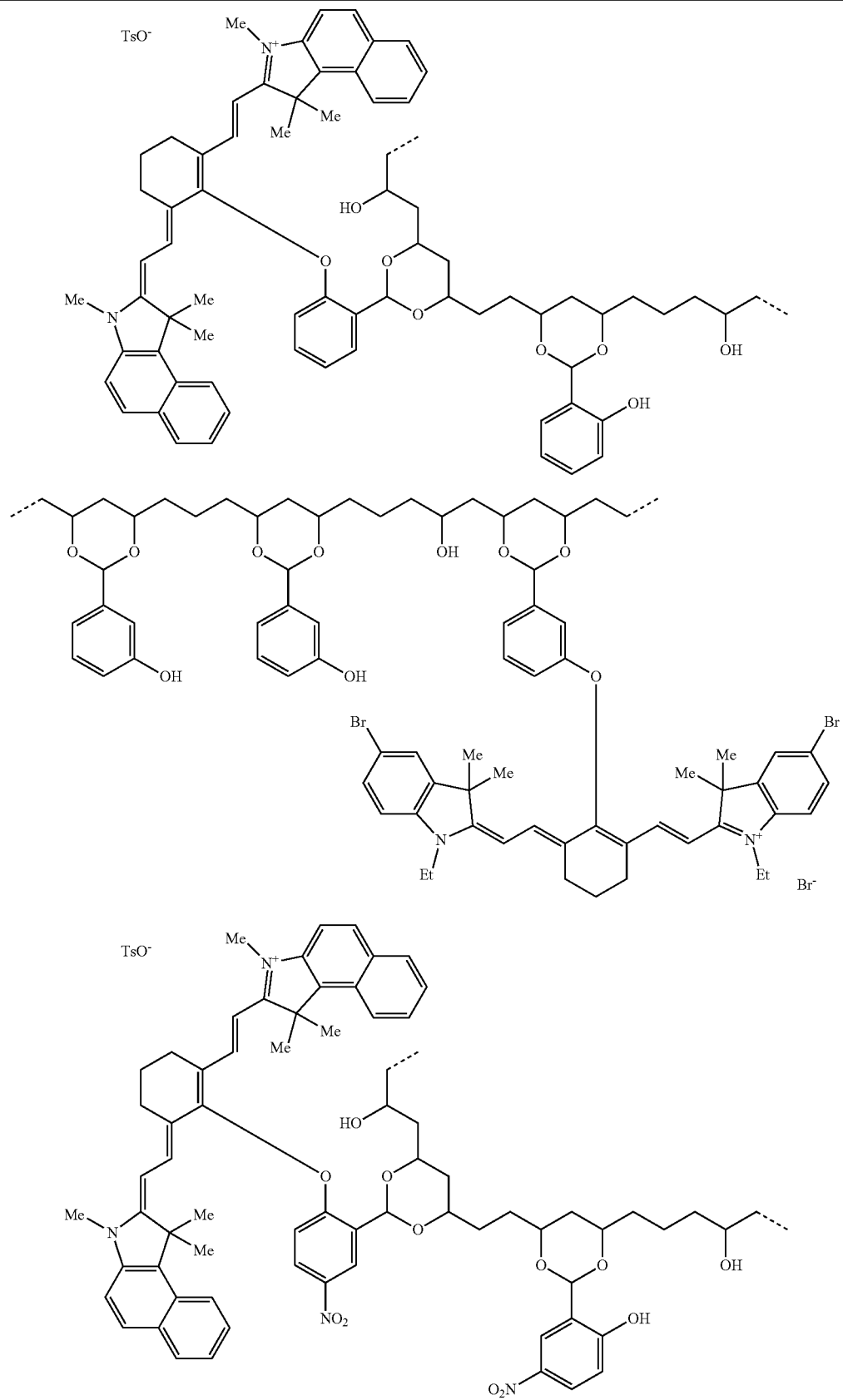

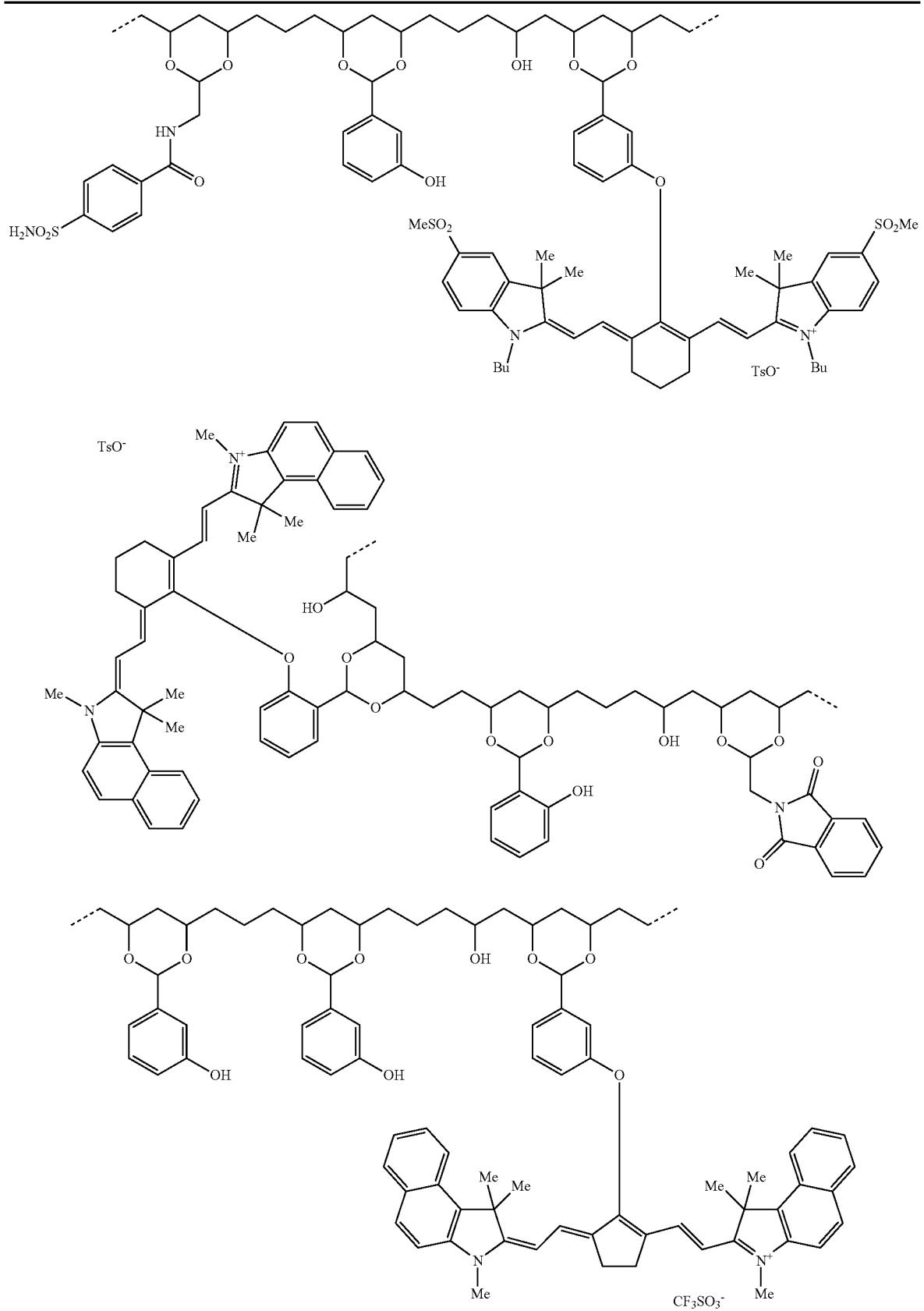

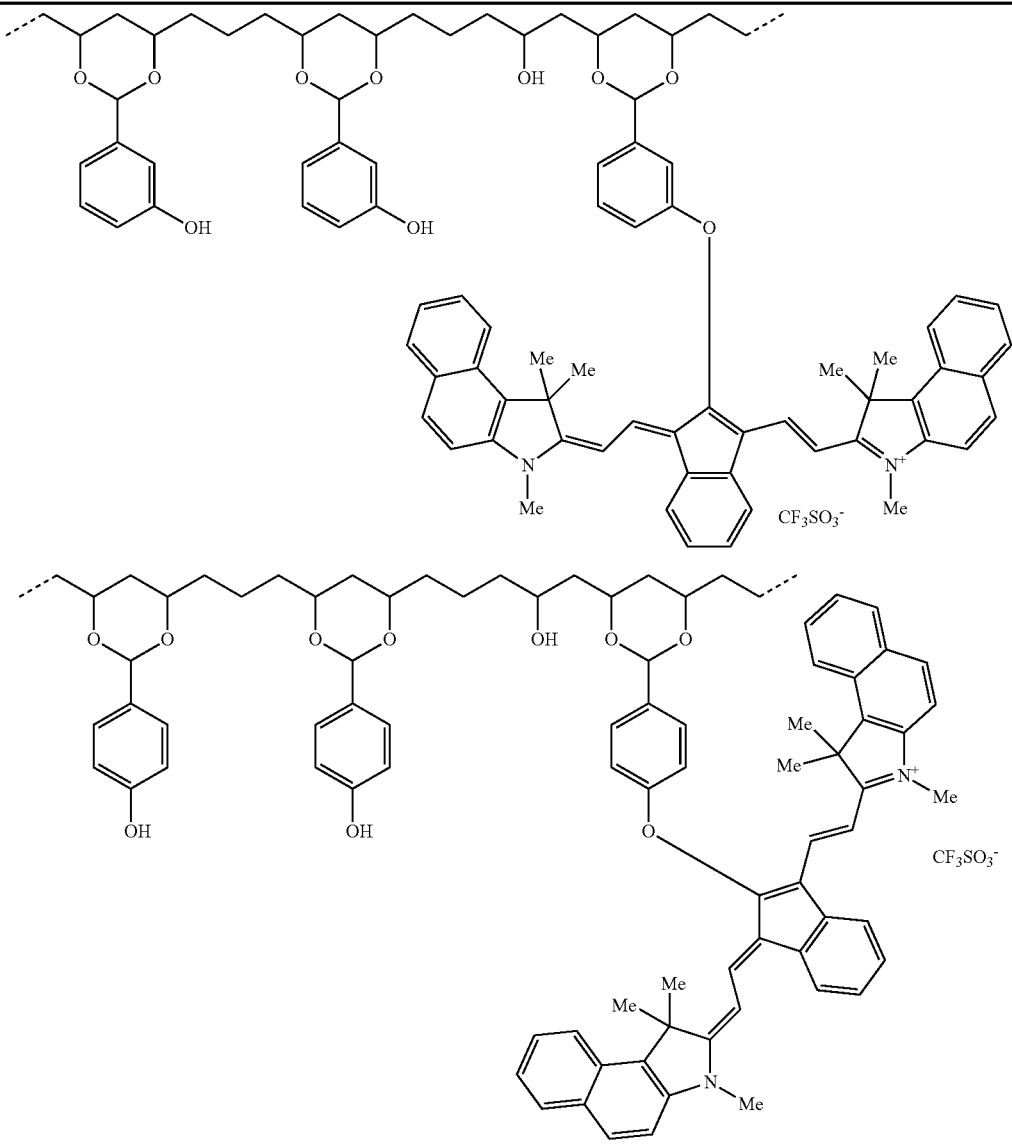

In a preferred embodiment of the present invention, suitable alkyl groups include 1 or more carbon atoms such as for example $C_1$ to $C_{22}$-alkyl groups, more preferably $C_1$ to $C_{12}$-alkyl groups and most preferably $C_1$ to $C_6$-alkyl groups. The alkyl group may be lineair or branched such as for example methyl, ethyl, propyl (n-propyl, isopropyl), butyl (n-butyl, isobutyl, t-butyl), pentyl, 1,1-dimethyl-propyl, 2,2-dimethylpropyl and 2-methyl-butyl, or hexyl. Suitable cycloalkyl groups are non-aromatic, homocyclic groups containing carbon atoms and may be monocyclic- or polycyclic. Examples include cyclopentyl, cyclohexyl or adamantyl.

The numeric average molecular weight (Mn) of the copolymers preferably ranges preferably from 15000 to 250000, more preferably from 25000 to 200000 and most preferably from 35000 to 150000. The weight average molecular weight (Mw) of the copolymers ranges preferably from 50000 to 350000, more preferably from 70000 to 325000 and most preferably from 100000 to 300000. The numeric average molecular weight (Mn) and the weight average molecular weight (Mw) are each determined by size exclusion chromatography.

The (ethylene, vinyl acetal) copolymers preferably can, besides the moieties as discussed above, contain further monomeric units as disclosed in U.S. Pat. No. 5,169,897, WO 1993/3068, U.S. Pat. No. 5,534,381, U.S. Pat. No. 5,698,360, JP 11-212252, JP 11-231535, JP 2000-039707, JP 2000-275821, JP 2000-275823, U.S. Pat. No. 6,087,066, WO 2001/9682, U.S. Pat. No. 6,270,938, U.S. Pat. No. 6,596,460, WO 2002/73315, WO 2002/96961, U.S. Pat. No. 6,818,378, WO 2004/20484, WO 2007/3030, WO 2009/5582 or WO 2009/99518.

The acetal moieties B, E and F described herein can be prepared using known reagentia and reaction conditions including those described in U.S. Pat. No. 6,541,181, U.S. Pat. No. 4,665,124, U.S. Pat. No. 4,940,646, U.S. Pat. No. 5,169,898, U.S. Pat. No. 5,700,619, U.S. Pat. No. 5,792,823, U.S. Pat. No. 5,849,842, WO 93/03068, DE 10011096; DE 3404366, U.S. Ser. No. 09/751,660, WO 01/09682, WO 03/079113, WO 2004/081662, WO 2004/020484, WO 2008/103258, and in JP 09-328,519.

Suitable polymers which can be used as starting material are copolymers of optionally substituted ethylene and vinyl alcohol. Acetalisation of two neighbouring vinyl alcohol units thereof with an aldehyde, e.g. phenolic aldehydes, produces acetal moieties.

This acetalization reaction generally requires addition of a strong inorganic or organic catalyst acid. Examples of catalyst acids are hydrochloric acid, sulfuric acid, phosphoric acid, p-toluenesulfonic acid, alkylsulfonic acid, perfluoroalkylsulfonic acid and other perfluoro-activated acids. The amount of acid added to the reaction mixture should allow effective protonation of the reagens but should not significantly alter the final product by causing unwanted hydrolysis of the acetal groups. The applied reaction temperature is preferably between 0° C. and the boiling point of the solvent and depends on the kind of reagens and on the desired level of substitution. The reaction product obtained often remains in solution even if the initial poly(ethylene, vinyl alcohol) reagent is not completely dissolved. Organic solvents as well as mixtures of water with organic solvents are used for the reaction. Incomplete dissolution of the poly(ethylene, vinyl alcohol) reagent is a disadvantage that may lead to an irreproducible degree of conversion. Therefore, in order to obtain reproducible products, solvents which allow complete dissolution of the initial poly(ethylene, vinyl alcohol) reagent in the reaction mixture are preferred. Suitable organic solvents are alcohols (such as methanol, ethanol, propanol, butanol, and glycol ether), cyclic ethers (such as 1,4-dioxane), and dipolar aprotic solvents (such as N,N-dimethylformamid, N-methyl pyrrolidone or dimethyl sulfoxide). The finished products may be isolated as a solid, by introducing the reaction mixture into a non-solvent under vigorous stirring, followed by filtering and drying. Water is especially suitable as a non-solvent for the polymers. Unwanted hydrolysis of the acetal group containing a hydroxyl-substituted aromatic group takes place much easier than for the acetal groups containing an aliphatic or non-substituted aromatic group. The presence of small amounts of water in the reaction mixture may lead to a decreased degree of acetalization and incomplete conversion of the aromatic hydroxy aldehyde used. In the absence of water, the hydroxy-substituted aromatic aldehydes react with hydroxyl groups of alcohols immediately and with almost 100% conversion. Therefore, it is desirable to remove the water from the reaction mixture during the reaction by for example distillation under reduced pressure. In addition, the remaining water may be removed by adding organic compounds to the reaction mixture which form volatile materials and/or inert compounds upon reaction with water. These organic compounds may be chosen from e.g. carbonates, orthoesters of carbonic or carboxylic acids such as diethylcarbonate, trimethyl orthoformate, tetraethyl carbonate, and tetraethyl orthosilicate such as silica-containing compounds. The addition of these materials to the reaction mixture typically leads to 100% conversion of the used aldehydes.

The light and/or heat sensitive coating preferably contains, besides at least two different (ethylene, vinyl acetal) copolymers as defined above, an alkaline soluble oleophilic resin. The oleophilic resin present in the coating is preferably a polymer that is soluble in an aqueous developer, more preferably an aqueous alkaline developing solution with a pH between 7.5 and 14. The oleophilic resin is preferably a phenolic resin selected from a novolac, a resol or a polyvinylphenolic resin. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858. In the preferred embodiment where the coating includes two layers, one or more alkaline soluble oleophilic resins may be present in the first layer, in the second layer or in both the first and the second layer. Preferably, one or more alkaline soluble oleophilic resin(s)—preferably a resole resin—is present in the second layer.

In the preferred embodiment where the (ethylene, vinyl acetal) binder is at least present in the second layer, the amount of phenolic resin optionally present in the coating is preferably at least 10% by weight relative, more preferably at least 20% by weight, most preferably at least 30% by weight relative to the total weight of all the components present in the coating.

The novolac resin or resol resin may be prepared by polycondensation of aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used. The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may be a polymer of one or more hydroxy-phenyl containing monomers such as hydroxystyrenes or hydroxy-phenyl(meth)acrylates. Examples of such hydroxystyrenes are o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene. Such a hydroxystyrene may have a substituent such as chloro, bromo, iodo or fluoro group or a $C_{1-4}$ alkyl group, on its aromatic ring. An example of such hydroxyphenyl(meth)acrylate is 2-hydroxy-phenyl methacrylate. The poly(vinylphenol) resin may be prepared by polymerizing one or more hydroxy-phenyl containing monomer in the presence of a radical initiator or a cationic polymerization initiator, or by copolymerizing of one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers. The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

The heat-sensitive coating may further contain one or more other binder(s) which is insoluble in water and soluble in an alkaline solution such as an organic polymer which has acidic groups with a pKa of less than 13 to ensure that the layer is soluble or at least swellable in aqueous alkaline developers. In the preferred embodiment where the coating includes two layers, this additional binder may be present in the first layer, in the second layer or in both the first and the second layer. Preferably, the binder is present in the first layer. The binder may be selected from a polyester resin, a polyamide resin, an epoxy resin, an acrylic resin, a methacrylic resin, a styrene based resin, a polyurethane resin or a polyurea resin. The binder may have one or more functional groups. The functional group(s) can be selected from the list of (i) a sulfonamide group such as —NR—SO$_2$—, —SO$_2$—NR— or —SO$_2$—NR'R'' wherein R and R' independently represent hydrogen or an optionally substituted hydrocarbon group such as an optionally substituted alkyl, aryl or heteroaryl group; more details concerning these polymers can be found in EP 2 159 049;

(ii) a sulfonamide group including an acid hydrogen atom such as —SO$_2$—NH—CO— or —SO$_2$—NH—SO$_2$— as for example disclosed in U.S. Pat. No. 6,573,022; suitable examples of these compounds include for example N-(p-toluenesulfonyl) methacrylamide and N-(p-toluenesulfonyl) acrylamide;

(iii) an urea group such as —NH—CO—NH—, more details concerning these polymers can be found in WO 01/96119;

(iv) a star polymer in which at least three polymer chains are bonded to a core as described in EP 2 497 639;

(v) a carboxylic acid group;

(vi) a nitrile group;

(vii) a sulfonic acid group; and/or (viii) a phosphoric acid group.

(Co)polymers including a sulfonamide group are preferred. Sulfonamide (co)polymers are preferably high molecular weight compounds prepared by homopolymerization of monomers containing at least one sulfonamide group or by copolymerization of such monomers and other polymerizable monomers. Preferably, the copolymer comprising at least one sulfonamide group is present in the first layer.

Examples of monomers copolymerized with the monomers containing at least one sulfonamide group include monomers as disclosed in EP 1 262 318, EP 1 275 498, EP 909 657, EP 1 120 246, EP 894 622, U.S. Pat. No. 5,141,838, EP 1 545 878 and EP 1 400 351. Monomers such as alkyl or aryl(meth)acrylate such as methyl(meth)acrylate, ethyl (meth)acrylate, butyl(meth)acrylate, benzyl(meth)acrylate, 2-phenylethyl(meth)acrylate, hydroxyethyl(meth) acrylate, phenyl(meth) acrylate; (meth)acrylic acid; (meth)acrylamide; a N-alkyl or N-aryl(meth)acrylamide such as N-methyl (meth)acrylamide, N-ethyl(meth)acrylamide, N-phenyl (meth)acrylamide, N-benzyl(meth)acrylamide, N-methylol (meth)acrylamide, N-(4-hydroxyphenyl)(meth)acrylamide, N-(4-methylpyridyl)(meth)acrylate; (meth)acrylonitrile; styrene; a substituted styrene such as 2-, 3- or 4-hydroxystyrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl acetal; vinyl butyral; a vinyl ether such as methyl vinyl ether; vinyl amide; a N-alkyl vinyl amide such as N-methyl vinyl amide, N-vinyl caprolactame, vinyl pyrrolydone; maleimide; a N-alkyl or N-aryl maleimide such as N-benzyl maleimide, are preferred.

Suitable examples of sulfonamide (co)polymers and/or their method of preparation are disclosed in EP 933 682, EP 982 123, EP 1 072 432, WO 99/63407, EP 1 400 351 and EP 2 159 049. A highly preferred example of a sulfonamide (co)polymer is described in EP 2 047 988 A in [0044] to [0046].

Specific preferred examples of sulphonamide (co)polymers are polymers comprising N-(p-aminosulfonylphenyl) (meth)acrylamide, N-(m-aminosulfonylphenyl)(meth)acrylamide N-(o-aminosulfonylphenyl)(meth)acrylamide and or m-aminosulfonylphenyl(meth)acrylate.

(Co)polymers including an imide group are also preferred as a binder in the heat-sensitive coating. Specific examples include derivatives of methyl vinyl ether/maleic anhydride copolymers and derivatives of styrene/maleic anhydride copolymers, that contain an N-substituted cyclic imide monomeric units and/or N-substituted maleimides such as a N-phenylmaleimide monomeric unit and a N-benzyl-maleimide monomeric unit. Preferably, this copolymer is present in the first layer located between the second layer and the hydrophilic support. This copolymer is preferably alkali soluble. Suitable examples are described in EP 933 682, EP 894 622 A to, EP 901 902, EP 0 982 123 A [007] to, EP 1 072 432 A to and WO 99/63407 (page 4 line 13 to page 9 line 37).

Polycondensates and polymers having free phenolic hydroxyl groups, as obtained, for example, by reacting phenol, resorcinol, a cresol, a xylenol or a trimethylphenol with aldehydes, especially formaldehyde, or ketones, may also be added to the heat-sensitive coating. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-phenylmaleimides are likewise suitable. Furthermore, polymers having units of vinylaromatics or aryl(meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl(meth)acrylate, of 4-hydroxystyrene or of hydroxyphenylmaleimide. The polymers may additionally contain units of other monomers which have no acidic units. Such units include vinylaromatics, methyl(meth)acrylate, phenyl(meth)acrylate, benzyl(meth)acrylate, methacrylamide or acrylonitrile.

The dissolution behavior of the coating can be fine-tuned by optional solubility regulating components. More particularly, developability enhancing compounds, development accelerators and development inhibitors can be used. In the preferred embodiment where the coating comprises more than one layer, these ingredients can be added to the first layer and/or to the second layer and/or to an optional other layer of the coating.

Suitable developability enhancing compounds are (i) compounds which upon heating release gas as disclosed in WO 2003/79113, (ii) the compounds as disclosed in WO 2004/81662, (iii) the compositions that comprises one or more basic nitrogen-containing organic compounds as disclosed in WO 2008/103258 and (iv) the organic compounds having at least one amino group and at least one carboxylic acid group as disclosed in WO 2009/85093.

Examples of basic nitrogen-containing organic compounds useful in the developability-enhancing compositions are N-(2-hydroxyethyl)-2-pyrrolidone, 1-(2-hydroxyethyl) piperazine, N-phenyldiethanolamine, triethanolamine, 2-[bis(2-hydroxyethyl)amino]-2-hydroxymethyl-1,3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Preferably N,N,N',N'-tetrakis(2-hydroxypropyl)-ethylenediamine is used. Mixtures of two or more of these compounds are also useful. The basic nitrogen-containing organic compounds can be obtained from a number of commercial sources including BASF (Germany) and Aldrich Chemical Company (Milwaukee, Wis.).

The basic nitrogen-containing organic compound(s) is preferably present in the coating in an amount of from 1 to 30% wt, and typically from 3 to 15% wt, based on the total solids of the coating composition.

Preferably, one or more of the basic nitrogen-containing organic compounds are used in combination with one or more acidic developability-enhancing compounds, such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides, since such a combination may permit further improved developing latitude and printing durability.

above 1500 g/mol and is present in an amount preferably less than 40% wt of the total coating composition, more preferably less than 10% wt and most preferably less than 5% wt. The low molecular weight component preferably has a molecular weight below 1500 g/mol and is present in an amount preferably less than 10% wt of the total weight composition, more preferably less than 5% wt and most preferably less than 2.5% wt. This type of contrast-enhancing system is preferably used in low pH developers, pH<12, which are substantially free of silicates.

The polymeric compound may be a derivative of a glycol such as for example polyethylenoxide, polypropyleneoxide and/or copolymers thereof, or a phenolic resin having a molecular weight lower than 100000 g/mol.

Specific examples of such high and low molecular weight developability enhancing compounds which are suitably used together are for example hyperbranched polyesters such as the Boltorn™ products commercially available from Perstorp, and the following compounds:

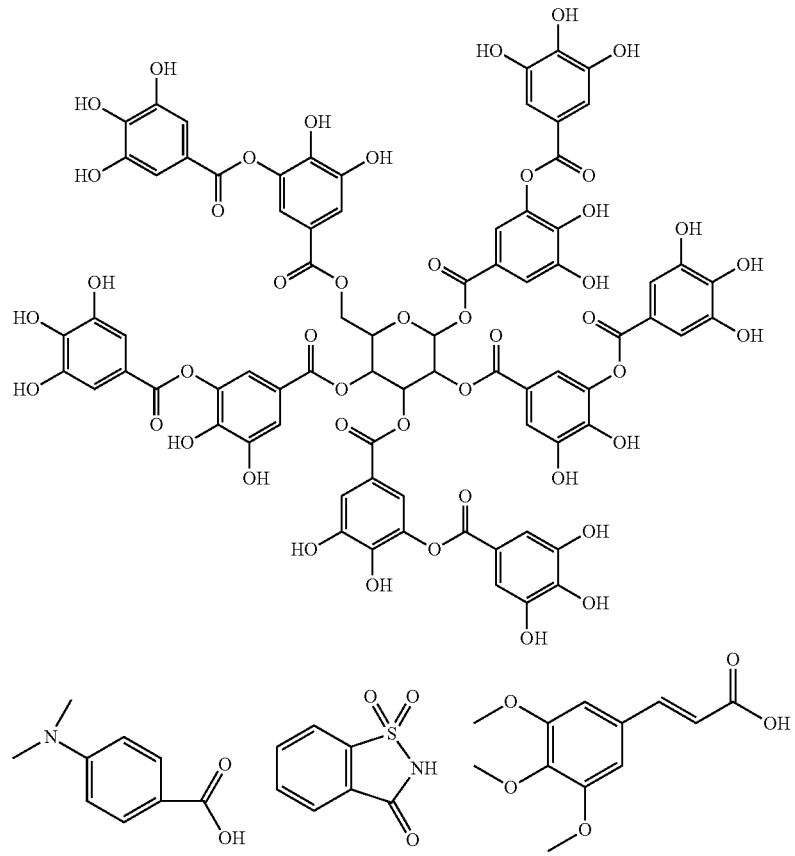

Representative examples of the acidic developability-enhancing compounds are provided in to of US 2005/0214677. They may be present in an amount of from 0.1 to 30% wt based on the total dry weight of the coating composition. The molar ratio of one or more basic nitrogen-containing organic compounds to one or more acidic developability-enhancing compounds is generally from 0.1:1 to 10:1 and more typically from 0.5:1 to 2:1.

Polymeric developability enhancing compounds combined with a low molecular weight developability enhancing compound as described above are also of interest. The polymeric compound preferably has a molecular weight Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4''-trihydroxy-triphenylmethane, and 4,4',3'',4''-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins comprising at least 70 mol % meta-cresol as recurring monomeric units are also suitable development accelerators.

In a preferred embodiment, the coating also contains developer resistance means, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 act as dissolution inhibitors due to interaction, e.g. by hydrogen bridge formation, with the alkali-soluble resin(s) in the coating. Inhibitors of this type typically are organic compounds which include at least one aromatic group and a hydrogen bonding site such as a nitrogen atom which may be part of a heterocyclic ring or an amino substituent, an onium group, a carbonyl, sulfinyl or sulfonyl group. Suitable dissolution inhibitors of this type have been disclosed in e.g. EP 825 927 and EP 823 327. Some of the compounds mentioned below, e.g. infrared dyes, such as cyanines, and contrast dyes, such as quaternized triarylmethane dyes, can also act as a dissolution inhibitor.

Other suitable inhibitors improve the developer resistance because they delay the penetration of the aqueous alkaline developer into the coating. Such compounds can be present in the first layer and/or in the optional second layer and/or in a development barrier layer on top of said layer, as described in e.g. EP 864 420, EP 950 517, WO 99/21725 and WO 01/45958. The solubility and/or penetrability of the barrier layer in the developer can be increased by exposure to heat and/or infrared light.

Water-repellent polymers represent another type of suitable dissolution inhibitors. Such polymers seem to increase the developer resistance of the coating by repelling the aqueous developer from the coating. The water-repellent polymers can be added to the first and/or second layer of the coating and/or can be present in a separate layer provided on top of these layers. In the latter preferred embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP 864 420, EP 950 517 and WO99/21725.

Preferred examples of inhibitors which delay the penetration of the aqueous alkaline developer into the coating include water-repellent polymers including siloxane and/or perfluoroalkyl units. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer is at least 2, preferably at least 10, more preferably at least 20. It may be less than 100, preferably less than 60.

The water-repellent polymer may be a block-copolymer or a graft-copolymer including a polar block such as a poly- or oligo(alkylene oxide) and a hydrophobic block such as a long chain hydrocarbon group, a polysiloxane and/or a perfluorinated hydrocarbon group. A typical example of a perfluorinated surfactant is Megafac F-177 available from Dainippon Ink & Chemicals, Inc. Other suitable copolymers comprise about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany.

A suitable amount of such a water-repellent polymer in the coating is between 0.5 and 25 mg/m$^2$, preferably between 0.5 and 15 mg/m$^2$ and most preferably between 0.5 and 10 mg/m$^2$. When the water-repellent polymer is also ink-repelling, e.g. in the case of polysiloxanes, higher amounts than 25 mg/m$^2$ can result in poor ink-acceptance of the non-exposed areas. An amount lower than 0.5 mg/m$^2$ on the other hand may lead to an unsatisfactory development resistance.

It is believed that during coating and drying, the water-repellent polymer or copolymer acts as a surfactant and tends to position itself, due to its bifunctional structure, at the interface between the coating and air and thereby forms a separate top layer, even when applied as an ingredient of the coating solution. Simultaneously, such surfactants also act as spreading agents which improve the coating quality. Alternatively, the water-repellent polymer or copolymer can be applied in a separate solution, coated on top of the coating including one or optional more layers. In that preferred embodiment, it may be advantageous to use a solvent in the separate solution that is not capable of dissolving the ingredients present in the other layers so that a highly concentrated water-repellent phase is obtained at the top of the coating.

The coating of the heat-sensitive printing plate precursor preferably also contains an infrared light absorbing dye or pigment which, in the preferred embodiment where the coating comprises more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

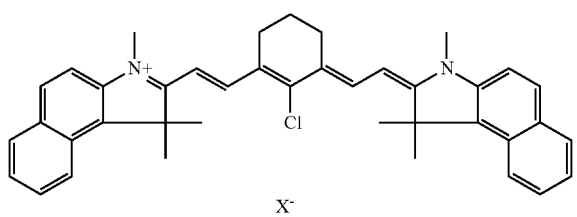

wherein X⁻ is a suitable counter ion such as tosylate.

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not substantially removed during the processing step. As a result, a visible image is formed which enables inspection of the lithographic image on the developed printing plate. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes.

Dyes such as di- or tri-arylmethane dyes, cyanine dyes, styryl dyes and merostyryl dyes, which, combined with specific additives, only slightly color the coating but which become intensively colored after exposure, as described in for example WO2006/005688 may also be used as colorants.

To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 µm, preferably from 0.1 to 3.0 µm, particularly preferably from 0.15 to 1.0 µm.

Optionally, the coating may further contain additional ingredients such as surfactants, especially perfluoro surfactants, inorganic fillers or polymers particles such as matting agents and spacers. Examples of inorganic fillers include silicon or titanium dioxide particles, zirconium oxide, kaolin clays and derivatives, silicium oxide based particles optionally coated and/or modified, alumina oxide, fumed silica and cerium oxide. The particles can be in the micrometer range, typically between 1 µm and 10 µm. More preferable, the particles are in the nanometer-range i.e. between 10 nm and 900 nm.

The lithographic printing plate precursor comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is a grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminum is preferably grained by electrochemical graining, and anodized by means of anodizing techniques employing phosphoric acid or a sulphuric acid/phosphoric acid mixture. Methods of both graining and anodization of aluminum are well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate has preferably an Ra value between 0.30 µm and 0.60 µm, more preferably between 0.35 µm and 0.55 µm and most preferably between 0.40 µm and 0.50 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight (g/m² $Al_2O_3$ formed on the aluminium surface) varies between 1 and 8 g/m². The anodic weight is preferably between 1.5 g/m² and 5.0 g/m², more preferably 2.5 g/m² and 4.0 g/m² and most preferably 2.5 g/m² and 3.5 g/m².

The grained and anodized aluminum support may be subject to a so-called post-anodic treatment to improve the hydrophilic character of its surface. For example, the aluminum support may be silicated by treating its surface with a solution including one or more alkali metal silicate compound(s)—such as for example a solution including an alkali metal phosphosilicate, orthosilicate, metasilicate, hydrosilicate, polysilicate or pyrosilicate—at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution, gluconic acid, or tartaric acid. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, acetals of polyvinyl alcohols formed by reaction with a sulphonated aliphatic aldehyde, polyacrylic acid or derivates such as GLASCOL E15™ commercially available from Ciba Speciality Chemicals. One or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

In a preferred embodiment, the support is first treated with an aqueous solution including one or more silicate compound(s) as described above followed by the treatment of the support with an aqueous solution including a compound having a carboxylic acid group and/or a phosphonic acid group, or their salts. Particularly preferred silicate compounds are sodium or potassium orthosilicate and sodium or potassium metasilicate. Suitable examples of a compound with a carboxylic acid group and/or a phosphonic acid group and/or an ester or a salt thereof are polymers such as polyvinylphosphonic acid, polyvinylmethylphosphonic acid, phosphoric acid esters of polyvinyl alcohol, polyacrylic acid, polymethacrylic acid and a copolymer of acrylic acid and vinylphosphonic acid. A solution comprising polyvinylphosphonic acid or poly(meth)acrylic acid is highly preferred.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP 1 025 992.

The lithographic printing plate precursor can be prepared by (i) applying on a support as described above the coating including the poly(vinyl acetal) resins of the present invention and (ii) drying the precursor.

Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

According to a preferred embodiment of the present invention there is also provided a method for making a positive-working lithographic printing plate comprising the steps of imagewise exposing the printing plate precursor followed by developing the imagewise exposed precursor so that the exposed areas are dissolved in the developer solution.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight, i.e. the wavelength range including near UV light (300-400 nm) and visible light (400-750 nm).

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern platesetters at $1/e^2$ of maximum intensity: 5-25 µm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD platesetters for thermal plates are typically characterized by a very high scan speed up to 500 m/sec and may require a laser power of several Watts. XTD platesetters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known platesetters can be used as an off-press exposure apparatus, which offers the benefit of reduced press down-time. XTD platesetter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

After exposure, the precursor is developed whereby the non-image areas of the coating are removed by immersion in a developer, preferably an aqueous alkaline developer, which may be combined with mechanical rubbing, e.g. by a rotating brush. The developer preferably comprises an alkaline agent which may be an inorganic alkaline agent such as an alkali metal hydroxide, an organic alkaline agent such as an amine, and/or an alkaline silicate such as an alkali metal silicate or an alkali metal metasilicate. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution comprising sodium or potassium metasilicate, i.e. a silicate where the ratio of silicon dioxide to alkali metal oxide is 1. The developer preferably has a pH above 8, more preferably above 10 and most preferably the developer has a pH between 10 and 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a polyhydroxyl compound such as e.g. sorbitol, preferably in a concentration of at least 40 g/l, and also a polyethylene oxide containing compound such as e.g. Supronic B25, commercially available from RHODIA, preferably in a concentration of at most 0.15 g/l. During development, any water-soluble protective layer present is also removed. In a preferred embodiment, the developer is substantially free of silicates e.g. alkali metal silicates or alkali metal metasilicates. More details concerning the development step can be found in for example EP 2 263 874, WO/2004071767 and US 2010/0047723.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants. A suitable gum solution which can be used after the development step is described in for example EP 1 342 568 and WO 2005/111727. The plate precursor can, if required, be further post-treated with a suitable correcting agent or preservative as known in the art.

To increase the resistance of the finished printing plate and hence to extend its press life capability (run length) the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The heat and/or light sensitive printing plates can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

The structural formulae shown below indicate the monomer composition of the prepared resins but the sequence of the moieties is for illustration only.

Unless otherwise specified, all compounds and solvents used in the Examples are readily available from fine chemical suppliers such as Acros or Aldrich.

Test Methods
LC-MS Analysis
A. Method 1
The LC-MS analysis according to method 1 was done on a HP 1100 Esquire LC, using an Altima HP C18 AQ column (150×3, 5 μm), operating at a flow rate of 0.5 ml/min and at 40° C. A gradient elution was used, with water+0.1% formic acid as eluent A and acetonitrile+0.1% formic acid as eluent B. The gradient according to the following Table was used.

| Time | % B |
|------|-----|
| 0    | 20  |
| 7    | 100 |
| 17   | 100 |
| 17.1 | 20  |
| 20   | 20  |

ESI ionisation was used in combination with a combibron detector. 5 μl of a solution of 2 mg of each compound in 10 ml acetonitrile was injected.

a. Method 2

The LC-MS analysis according to method 2 was done on a HP 1100 Esquire LC, using an Altima HP C18 AQ column (150×3, 5 μm), operating at a flow rate of 0.5 ml/min and at 40° C. A gradient elution was used, H$_2$O/MeOH 9/1 containing 10 mmol NH$_4$OAc as eluent A and MeOH containing 10 mmol NH$_4$OAc as eluent B. The gradient according to the following Table was used.

| Time | % B |
|------|-----|
| 0    | 0   |
| 12   | 100 |
| 17   | 100 |
| 18   | 0   |
| 20   | 0   |

ESI ionisation was used in combination with a combibron detector. 5 μl of a solution of 2 mg of each compound in 10 ml acetonitrile was injected.

$^1$H-NMR Analysis

A Varian Unity Inova spectrometer was used, using DMSO d6 as solvent at 25° C. with DMSO d5 (2.50 ppm) as internal reference at a spectrometer frequency of 400 MHz.

Synthesis of Resin 1

Reaction scheme:

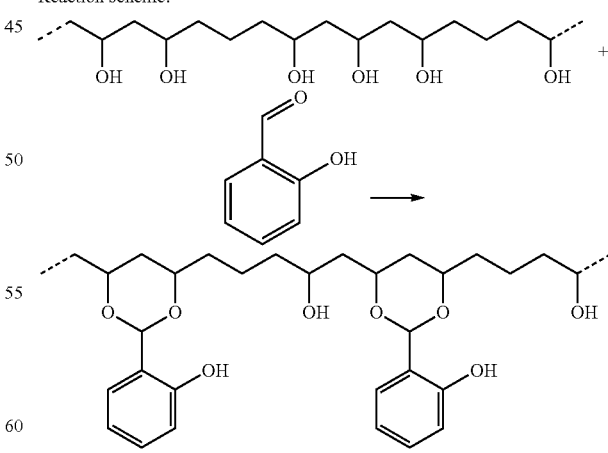

13.6 g of an ethylene vinyl alcohol copolymer (27 mol % ethylene, EVAL SP521 B, supplied by Kuraray) was dissolved in 50 g dimethyl acetamide at 85° C. 0.3 g (3.13 mmol) methane sulfonic acid in 5.6 g dimethyl acetamide was added and the mixture was stirred for 10 minutes at 85°

C. 12.2 g (0.1 mol) salicylic aldehyde in 11.3 g dimethyl acetamide was added slowly while keeping the reaction temperature at 80° C. The reaction was allowed to continue for 1 hour at 80° C. 11.1 g (0.105 mol) trimethyl orthoformate in 5.6 g dimethyl acetamide was added and the reaction was allowed to continue for 90 minutes at 80° C. 0.92 g (3.13 mmol) quadrol (CASRN102-60-3) in 7 g dimethyl acetamide was added and the reaction mixture was stirred for 10 minutes. The reaction mixture was allowed diluted with 90 ml 1-methoxy-2-propanol and cooled down to room temperature. The reaction mixture was further diluted with 100 ml 1-methoxy-2-propanol. The mixture was slowly added to 1 l water to precipitate Resin 1. Resin 1 was isolated by filtration and treated with a mixture of 400 ml water en 100 ml 1-methoxy-2-propanol for 16 hours. Resin 1 was isolated by filtration and dried. 21 g of Resin 1 was isolated.

Resin 1 was analyzed using $^1$H-NMR spectroscopy. (20 mg of the polymer was dissolved in DMSO-d6: the aromatic protons of the polymer bound phenolic fragments:

6.75 ppm (2H), 7.11 ppm (1H), 7.32 ppm (1H), the acetal protons: 5.70 ppm and 5.99 ppm (together 1H), the phenolic proton: 9.30 ppm (1H)).

Synthesis of Resin 2 hyde, dissolved in 30 g of dimethyl acetamide at 35° C., was added over 20 minutes and the reaction was allowed to continue at 80° C. for 20 hours. 50 g of ethyl acetate was added and the ethyl acetate was distilled under reduced pressure, gradually reducing the pressure from 500 mbar to 50 mbar, while maintaining the reactor jacket temperature at 105° C. Upon complete distillation, the reaction mixture was cooled to room temperature and 1 g (10 mmol) of triethyl amine in 20 g of dimethyl acetamide was added. 80 g of 2-methoxy-1-propanol was added and the reaction mixture was slowly added to 1 liter of ice/water. The mixture was stirred for 2 hours and the precipitated polymer was isolated by filtration. The isolated polymer was redispersed in 400 ml of water and 100 ml of 2-methoxy-1-propanol, stirred for 3 hours, isolated by filtration and dried. 23.2 g of Resin 2 was isolated.

Resin 2 was analyzed using $^1$H-NMR spectroscopy. (20 mg of the polymer was dissolved in DMSO-d6: the aromatic protons of the polymer bound 4-nitro-phenol fragments: 6.97 ppm (1H), 8.06 ppm (1H), 8.21 ppm (1H), the acetal protons: 5.76 ppm and 5.94 ppm (together 1H), the phenolic proton: 11.2 ppm (1H)).

Synthesis of Resin 3

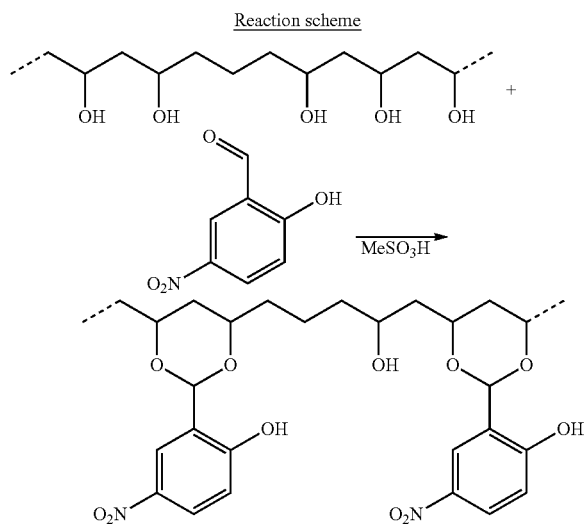

EXPERIMENTAL PROCEDURE 11.4 (0.1 mol) of poly(ethylene, vinyl alcohol) (32 mol % ethylene, supplied by Aldrich) was added to 80 g of dimethyl acetamide and the reaction mixture was heated to 80° C. The mixture was stirred for one and a half hour at 80° C. Upon complete dissolution of the polymer, 0.48 g (5 mmol) of methane sulfonic acid in 4.5 g of dimethyl acetamide was added. The mixture was stirred for an additional 30 minutes at 80° C. 16.4 g (0.1 mol) of 2-hydroxy-5-nitro-benzalde-

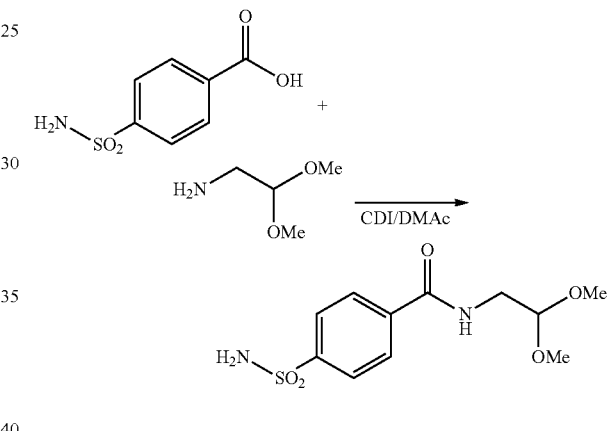

240 g (1.2 mol) 4-aminosulfonyl-benzoic acid was dissolved in 2.5 l dimethylacetamide. 233.5 g (1.44 mol) N,N'-carbonyldiimidazole was added portionwise over 15 minutes. The reaction was allowed to continue for 1 hour at room temperature. 151.4 g (1.44 mol) 2,2-dimethoxy-ethylamine was added and the temperature rose to 45° C. The reaction was allowed to continue for 2 hours at room temperature. The solvent was evaporated under reduced pressure to one third of its volume and the mixture was added to 3 l water. N-(2,2-dimethoxy-ethyl)-4-sulfamoyl-benzamide precipitated from the medium. N-(2,2-dimethoxy-ethyl)-4-sulfamoyl-benzamide was isolated by filtration, washed with water and dried. 228 g N-(2,2-dimethoxy-ethyl)-4-sulfamoyl-benzamide was isolated (y:65.8%, TLC-analysis on TLC Silica gel 60 F254, supplied by Merck: eluent methylene chloride/methanol:90/10:R$_f$:0.25).

Synthesis of Resin 3:

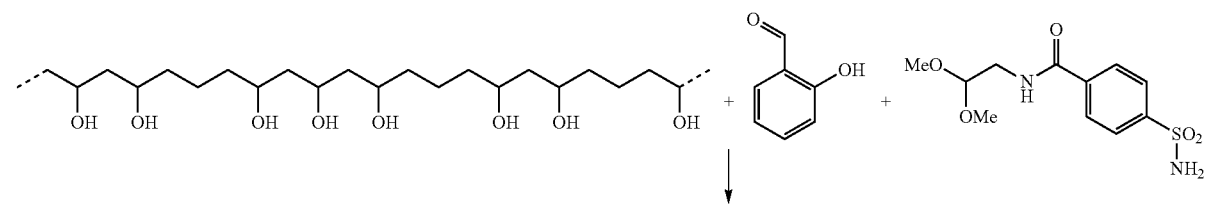

-continued

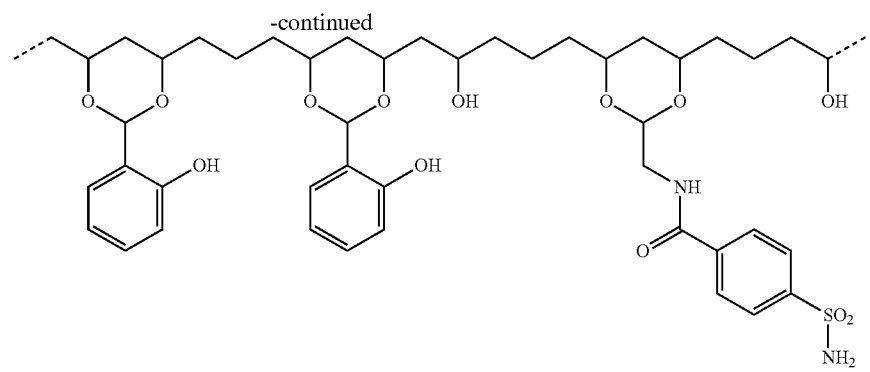

71.6 g EVAL M100B was dissolved in 280 g dimethyl sulfoxide at 100° C. The mixture was stirred for one hour. The reaction temperature was lowered to 80° C. and the polymer was allowed to dissolve over night. A solution of 1.7 g (17.5 mmol) methane sulfonic acid in 30 g dimethyl sulfoxide was added and the mixture was stirred for 10 minutes. A solution of 20.2 g (0.07 mol) N-(2,2-dimethoxyethyl)-4-sulfamoyl-benzamide in 42 g dimethyl sulfoxide was added and the reaction was allowed to continue for four and a half hours at 80° C., followed by the addition of a solution of 59.8 g (0.49 mol) salicylic acid in 42 g dimethyl sulfoxide. The reaction was allowed to continue for 30 minutes at 80° C. A solution of 49 g (0.46 mol) trimethyl orthoformate in 21 g dimethyl sulfoxide was added and the reaction was allowed to continue for one hour at 80° C. The reaction was allowed to cool down to 70° C. and 5.1 g quadrol, dissolved in 14 g dimethyl sulfoxide, was added. The reaction mixture was allowed to cool down to room temperature and diluted with 2000 g 2-methoxy-1-propanol. The mixture was slowly added to 17 l water. The mixture was stirred for six hours. Resin 3 was isolated by filtration and washed with a mixture of 900 ml water and 100 ml 2-methoxy-1-propanol. Resin 3 was treated with a mixture of 10 l water and 1 l 2-methoxy-1-propanol, stirred for 90 minutes, isolated by filtration and dried. 110 g of Resin 3 was isolated.

Resin 3 was analyzed using $^1$H-NMR spectroscopy. 20 mg of resin 5 was dissolved in 0.8 ml DMSO-d6. The aromatic protons of the phenolic moieties: 7.31 ppm, 7.10 ppm, 6.73 ppm; the phenolic OH: 9.3 ppm; the acetal proton: 5.98 ppm, 5.71 ppm; the benzenesulfonamide protons: 7.98 ppm, 7.87 ppm; the molar ratio of the benzenesulfonamide moieties on the phenolic moieties: 12 on 100).

Preparation of the Lithographic Support S-01

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm$^2$ (charge density of about 800 C/dm$^2$). Afterwards, the aluminium foil was desmutted by etching with an aqueous solution containing 6.5 g/l of sodium hydroxide at 35° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and an anodic charge of 250 C/dm$^2$, then washed with demineralised water for 7 seconds and dried at 120° C. for 7 seconds.

Subsequently, the obtained support was post-treated by spraying a solution containing 2.2 g/l polyvinylphosphonic acid (PVPA) for 4 seconds at 70° C. onto the support, rinsing the treated support with demineralised water for 3.5 seconds followed by drying at 120° C. for 7 seconds.

The support thus obtained was characterised by a surface roughness $R_a$ of 0.45-0.50 μm (measured with interferometer NT3300 and had an anodic weight of about 3.0 g/m$^2$ (gravimetric analysis).

Example 1

1. Printing Plates PP-01 to PP-05/One Layer.
Preparation of Printing Plate Precursors PPP-01 to PPP-05

The comparative printing plate precursor PPP-01 was produced by applying onto the grained and anodized aluminium support S-01 the coating solution CS-01 by means of a semi-automated coating device. The inventive printing plate precursors PPP-02 to PPP-05 were produced by applying onto the support S-01 the coating solution CS-02 by means of a semi-automated coating device. The coating solution was applied at a wet coating thickness of 26 μm and then dried at 100° C. for 1 minute. The printing plate precursors PP-01 to PP-05 were obtained (Table 2).

TABLE 1

| Composition of the coating solutions CS-01 and CS-02 | | |
|---|---|---|
| INGREDIENTS (g) | CS-01 | CS-02 |
| 1-methoxy-2-propanol | 23.02 | 23.02 |
| methyl ethyl keton | 42.45 | 42.45 |
| Megaface T-253 (1) | 0.036 | 0.036 |
| Resin 1 (2) | 10.38 | — |
| Resin 1 and Resin 3 (2) (ratio as defined in Table 2 below) | — | 10.38 |

TABLE 1-continued

Composition of the coating solutions CS-01 and CS-02

| INGREDIENTS (g) | CS-01 | CS-02 |
|---|---|---|
| Contrast dye (3) | 2.72 | 2.72 |
| IR dye (4) | 0.07 | 0.07 |
| Resole (5) | 0.036 | — |

(1) Fluorinated acrylic copolymer, commercially available from Dainippon Ink;

(2) Resin 1 and Resin 3 are synthesized and characterized as described above;

(3) Solution in 1-methoxy-2-propanol of 1% by weight of Crystal Violet, commercially available from Ciba-Geigy GmbH.;

(4) Infrared cyanine dye, commercially available from FEW CHEMICALS having the following chemical structure:

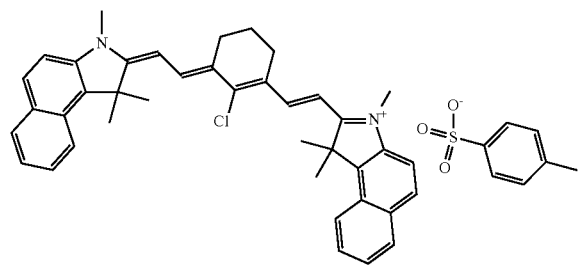 [SMILES: CN1/C(=C/C=C2\CCCC(/C=C/C3=[N+](C)c4ccc5ccccc5c4C3(C)C)=C2Cl)C(C)(C)c2c1ccc1ccccc21 ; Cc1ccc(S(=O)(=O)[O-])cc1]

(5) 50 wt. % solution in 1-methoxy-2-propanol of Bakelite PF9900LB, a resole commercially available from Hexion Specialty Chemicals AG.

TABLE 2 printing plate precursors PPP-01 to PPP-05

| Printing Plate Precursor | Resin 1 (1) % wt | Resin 3 (1) % wt |
|---|---|---|
| PPP-01 comparative | 100% wt | — |
| PPP-02 inventive | 90% wt | 10% wt |
| PPP-03 inventive | 80% wt | 20% wt |
| PPP-04 inventive | 70% wt | 30% w |
| PPP-05 inventive | 60% wt | 40% wt |

(1) Resin 1 and Resin 3 are synthesized and characterized as described above.

Exposure

The printing plate precursors PP-01 to PP-05 were image-wise exposed at a range of energy densities with a Creo Trendsetter, a platesetter having a 20 W infrared laser head (830 nm), operating at 140 rpm and 2400 dpi, commercially available from Kodak Corp. The image had a 50% dot coverage and consisted of a 10 μm×10 μm checkerboard pattern.

The "right exposure" (RE) sensitivity was determined and is defined as the energy density value (mJ/cm$^2$) at which the 1×1 checkerboard pattern on the plate after processing has the same density as the 8×8 checkerboard pattern. The density was measured with a Gretag-MacBeth D19C densitometer, commercially available from GretagMacbeth AG. The automatic colour filter setting was used.

Development

Subsequently, the exposed printing plate precursors were treated with a developer (developer temperature=25° C.) for a pre-defined time (developer dwell time=25 seconds) and then thoroughly rinsed with water. The composition of the developer solution is given in Table 3.

TABLE 3 composition of the developer solution.

| Composition (1) | Active ingredients g/l |
|---|---|
| Sodium hydroxide (2) | 2.3 |
| Sodium metasilicate pentahydrate (3) | 66 |
| LiCl | 4 |
| Akypo RLM 45CA (4) | 3.68 |
| Briquest 543-25S (5) | 1.8 |
| Ralufon DCH (6) | 3.7 |
| Crodateric CYAP (7) | 5 |
| SAG220 (8) | 0.1 |

(1) The pH of DEV-01 is 12.9 and the conductivity 82 mS/cm +/− 0.1 mS/cm (measured at 20° C.). The ingredients are added to demineralized water (total 1 liter);

(2) 50 wt. % solution of NaOH in water;

(3) metasilicate commercially available from Simaco NV;

(4) 90 wt. % alcohol ether carboxylate surfactant solution in water, commercially available from Kao Chemicals GmbH;

(5) 25 wt. % solution of the following compound in water, $$(OH)_2P(=O)-CH_2-N((CH_2)_2-N(CH_2P(OH)_2(=O))-(CH_2)_2-N(CH_2P(OH)_2(=O))_2)-CH_2-P(=O)(OH)_2$$

commercially available from Rhodia Ltd. (Briquest 543-25S):

(6) Ralufon DCH:

$$O=S(=O)(O^-)-CH_2CH_2CH_2-N^+(CH_3)_2-R1$$

(7) sodium amphopropionate, commercially available from Lankem Surfactants;

(8) SAG220 Anti-Foam Emulsion, polydimethylsiloxane emulsion in water (20 wt % active material), commercially available from Momentive Performance Materials Inc..

Results

1. Sensitivity

The RE sensitivity, determined as described above, obtained for the printing plate precursors according to the present invention PP-02 to PP-05, i.e. the printing plate precursors including at least two ethylene (vinyl acetal) binders used in the present invention—i.e. Resin 1 and Resin 3, are similar to the sensitivity obtained for the comparative printing plate precursor PP-01 including only one ethylene (vinyl acetal) binder.

2. Contrast Evaluation

The contrast between the image and non-image areas was determined after development. The contrast is defined as the difference in optical density between the exposed areas and non-exposed areas after development. The optical density (OD) is measured with a GretagMacbeth D19C densitometer, commercially available from GretagMacbeth AG. The contrast was determined as follows:

first, the OD was determined of a non-coated aluminum substrate (blank substrate); then the OD of the exposed parts (Dmin) and of the non-exposed parts (Dmax) was measured at different energy densities.

The contrast at RE energy density (see above) is defined as the difference between these two values: ΔD=Dmax−Dmin. The higher the contrast ΔD the better the lithographic quality of the plate.

The results of the contrast evaluation are summarized in Table 4 below.

TABLE 4 result of the contrast evaluation

| Printing Plate | Resin 1 | Resin 3 | ΔD* |
|---|---|---|---|
| PP-01 comparative | 100% | — | 4 |
| PP-02 Inventive | 90% | 10% | 5 |
| PP-03 Inventive | 80% | 20% | 5 |
| PP-04 Inventive | 70% | 30% | 5 |
| PP-05 Inventive | 60% | 40% | 5 |

*ΔD is rated as follows:
5: OD > 1, excellent contrast;
4: 0.9 < OD ≤ 1, very good contrast;
3: 0.7 < OD ≤ 0.9, moderate contrast;
2: 0.5 < OD ≤ 0.7, unacceptable contrast;
1: 0.3 < OD ≤ 0.5, unacceptable to no contrast;
0: OD ≤ 0.3, no contrast.

The results show that all the printing plates—the printing plates of the present invention including at least two different (ethylene vinyl) acetal copolymers used in the present invention (PP-02 to PP-05) and the comparative printing plate including only one (ethylene vinyl) acetal copolymer used in the present invention (PP-01)—show an excellent contrast after development.

3. Chemical Resistance Evaluation

The chemical resistance of the printing plates PP-01 to PP-05 was evaluated by means of a printing test described below.

Eight samples of each printing plate were mounted on a webfed offset press (Drent Gazelle F480). 2.5% wt Prima FS404 in 5% isopropanol was used as fountain solution, commercially available from Agfa Graphics NV and UV curable ink (Supra UV Magenta 568011, commercially available from Janecke+Schneeman) was used to print on a low quality web paper such as for example newspaper 45 g, commercially available from Stora Enso. The optical density was measured on print after 40000 prints: three measurements per sample resulting in 24 measurements for each printing plate. The average value was calculated.

The optical density obtained under these chemically aggressive conditions is a measure of the chemical resistance of the tested plates. The optical density was measured with a densitometer GretagMacbeth D19C, commercially available from GretagMacbeth AG.

The results of the chemical resistance of the printing plates are given in Table 5.

TABLE 5

Chemical resistance in terms of optical density of the printing plates.

| Printing Plate | Resin 1* | Resin 3* | CR** |
|---|---|---|---|
| PP-01 comparative | 100% | — | 1 |
| PP-02 inventive | 90% | 10% | 3.5 |
| PP-03 inventive | 80% | 20% | 13.5 |
| PP-04 inventive | 70% | 30% | 43.4 |
| PP-05 inventive | 60% | 40% | 60.8 |

*Resin 1 and Resin 3 are synthesized and characterized as described above;
**The optical density (OD) of the different plates was measured after 40000 prints and normalised to the optical density of the comparative example and is defined as the chemical resistance (CR):

$$CR = \frac{OD_{PP-0x}}{OD_{PP-01}} \text{ with } x = 2, 3, 4 \text{ or } 5$$

The inventive printing plates including at least two different (ethylene vinyl) acetal copolymers used in the present invention (PP-02 to PP-05) provide an improved chemical resistance compared to the comparative printing plate PP-01 including only one (ethylene vinyl) acetal copolymer. The optical density of the printed sheets was up to a 60-fold higher after 40000 prints for inventive printing plate PP-05 in comparison to the comparative printing plate PP-01.

4. Abrasion Test

The abrasion resistance was tested as follows.

Six round rubber (hardness 75 Shore A) stamps with a diameter of 15 mm were simultaneously rotated in contact with the test sample with a load of 9.5 N each and while the coating is wet (4 ml demineralised water per contact area). Fifty test cycles were applied to each test sample, each test cycle consists of 25 seconds of contact at a rotational speed of 100 rpm and 1 second of non-contact in order to allow the demineralised water to recover the contact area.

In this way, five samples of each test sample PP-01 to PP-05 were tested, resulting in a total of 30 contact areas subjected to abrasion per test sample.

A quantitative assessment of the resulting wear of the contact areas of the test samples was performed as follows. Each of the 30 contact areas subjected to abrasion was scanned in with a HP Scanjet 5590P (commercially available from HP) both before and after rotational contact abrasion. The automatic exposure and colour adjustment parameters setting was switched off and instead the following exposure parameter values were set manually: "0", "−69" and "0" for respectively the high lights, the shadows and the midtones. The resulting images were converted to 8 bit grey-scale images (grey-level values from 0 to 255, whereby 0 represents "black" and 255 represents "white"). The coating wear was calculated from the measured change in coating grey-level value:

Relative coating wear (RCW, %)=[(grey-level value after rotational abrasion/grey-level value before rotational abrasion)−1]×100.

The obtained RCW was normalised relative to the comparative PP-01 and is a measure for the abrasion resistance of the plates. The results are given in Table 6.

TABLE 6

Abrasion resistance of the printing plates PP-01 to PP-05.

| Printing Plate | Resin 1* | Resin 3* | Abrasion resistance |
|---|---|---|---|
| PP-01 comparative | 100% | — | 1.0 |
| PP-02 inventive | 90% | 10% | 1.0 |
| PP-03 inventive | 80% | 20% | 1.1 |
| PP-04 inventive | 70% | 30% | 0.98 |
| PP-05 Inventive | 60% | 40% | 0.95 |

*Resin 1 and Resin 3 are synthesized and characterized as described above;

The results of the abrasion test given in Table 6 indicate that the printing plates PP-01 to PP-05 all have a similar, high abrasion resistance.

5. Conclusion

TABLE 7

Chemical resistance and abrasion resistance of PP-01 to PP-05

| Printing Plate | Resin 1* | Resin 3* | Chemical Resistance* | Abrasion resistance* |
|---|---|---|---|---|
| PP-01 comparative | 100% | — | +/− | +++ |
| PP-02 inventive | 90% | 10% | + | +++ |

TABLE 7-continued

Chemical resistance and abrasion resistance of PP-01 to PP-05

| Printing Plate | Resin 1* | Resin 3* | Chemical Resistance* | Abrasion resistance* |
|---|---|---|---|---|
| PP-03 inventive | 80% | 20% | + | +++ |
| PP-04 inventive | 70% | 30% | ++ | +++ |
| PP-05 inventive | 60% | 40% | ++ | +++ |

*Resin 1 and Resin 3 are synthesized and characterized as described above.

The results as summarized in Table 7 show that the printing plates according to the present invention all have an excellent abrasion resistance while the balance between the chemical resistance and the abrasion resistance is better for the inventive printing plates.

Example 2

Printing Plates PP-06 to PP-08/Two Layers.
Preparation of the Printing Plate Precursors PPP-06 to PPP-08

The printing plate precursors PPP-06 to PPP-08 were produced by first applying onto the grained and anodized aluminium support S-01 (see Example 1) the coating solution CS-03 (PPP-06), CS-04 (PPP-07) and CS-05 (PPP-08) by means of a semi-automated coating device at a wet coating thickness of 26 μm and then dried at 100° C. for 1 minute.

After drying, a second coating solution CS-01 (see Example 1) was applied by means of a semi-automated coating device at a wet coating thickness of 26 μm and then dried at 100° C. for 1 minute. The Printing Plate precursors PP-06 to PP-08 were obtained (Table 9).

The ingredients of the coating solutions CS-03, CS-04 and CS-05 are given in Table 8.

TABLE 8 composition of the coating solutions CS-03, CS-4 and CS-05

| INGREDIENTS (g) | CS-03 | CS-04 | CS-05 |
|---|---|---|---|
| 1-methoxy-2-propanol | 21.23 | 21.23 | 21.23 |
| THF | 58.38 | 58.38 | 58.3 |
| Polysulfonamide (1) | 13.69 | — | — |
| Polysulfonamide (1) and Resin 1 (2): ratio 90/10 see Table 4 below | — | 13.69 | — |
| Polysulfonamide (1) and/or Resin 2 (2): ratio 90/10 see Table 4 below | — | — | 13.69 |
| Contrast dye (3) | 5.02 | 5.02 | 5.02 |

TABLE 8-continued composition of the coating solutions CS-03, CS-4 and CS-05

| INGREDIENTS (g) | CS-03 | CS-04 | CS-05 |
|---|---|---|---|
| IR dye (4) | 1.26 | 1.26 | 1.26 |
| Tego 410 (5) | 0.42 | 0.42 | 0.42 |

(1) Polysulfonamide binder; copolymer of sulfadimidine methacrylamide and phenylacrylamide (mole ratio 65:35), cfr. Polymer-01 synthesis as described in EP 2 159 049;
(2) Resin 1 and Resin 3 are synthesized and characterized as described above;
(3) Quaterised triarylmethane, solution in 1-methoxy-2-propanol of 1% by weight of Crystal Violet, commercially available from Ciba-Geigy GmbH..
(4) Infrared cyanine dye, commercially available from FEW CHEMICALS having the following chemical structure:

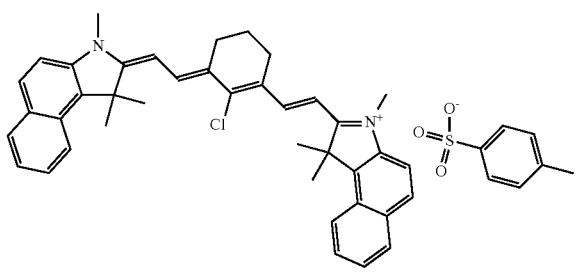 [SMILES: CN1/C(=C/C=C2\CCCC(/C=C/C3=[N+](C)c4ccc5ccccc5c4C3(C)C)=C2Cl)C(C)(C)c2c1ccc1ccccc21 ; Cc1ccc(S(=O)(=O)[O-])cc1]

(5) Polydimethyl siloxane-polyether surfactant, commercially available from Tego Chemie, Essen, Germany; 10 wt. % solution in methoxypropanol.

TABLE 9

Ratio (% wt) of the binders present in the printing plate precursors PPP-06 to PPP-08

| Printing Plate Precursor | First Layer | | | Second Layer |
|---|---|---|---|---|
| | PS (1) % wt | Resin 1 (2) % wt | Resin 2 (2) % wt | Resin 1 (2) |
| PPP-06 comparative | 100% wt | — | — | 100% wt |
| PPP-07 comparative | 90% wt | 10% wt | — | 100% wt |
| PPP-08 inventive | 90% wt | — | 10% w | 100% wt |

(1) Polysulfonamide binder; copolymer of sulfadimidine methacrylamide and phenylacrylamide (mole ratio 65:35), cfr. Polymer-01 synthesis as described in EP 2 159 049;
(2) Resins 1 and 2 are synthesized and characterized as described above.

Exposure and Development

The printing plate precursors PPP-06 to PPP-08 were image-wise exposed and subsequently developed as described in Example 1 above.

Results

1. Sensitivity

The RE sensitivity, determined as described above, obtained for the printing plate precursor according to the present invention PPP-08, i.e. the printing plate precursor including at least two (ethylene vinyl acetal) resins used in the present invention, are similar to the sensitivity of the comparative printing plate precursors PPP-06 and PPP-07 including only one type of (ethylene, vinyl acetal) copolymer used in the present invention.

2. Contrast Evaluation

The contrast between the image and non-image areas was determined after development as described in Example 1.

The results of the contrast evaluation are summarized in Table 10 below.

TABLE 10

| Printing Plate | ΔD * |
|---|---|
| PP-06 comparative | 4 |
| PP-07 comparative | 5 |
| PP-08 inventive | 5 |

\* see Table 4 above

The results show that all the printing plates have an excellent contrast after development.

1. Chemical Resistance and Abrasion Resistance Evaluation

The chemical resistance and the Abrasion Resistance of the printing plates PP-06 to PP-08 was evaluated as described in Example 1 and the obtained results are summarized in Table 11.

TABLE 11

Chemical resistance and Abrasion Resistance of the printing plates.

| Printing Plate | Chemical resistance | Abrasion Resistance |
|---|---|---|
| PP-06 comparative | +++ | + |
| PP-07 comparative | + | +++ |
| PP-08 inventive | ++ | +++ |

The results show that the chemical resistance of the printing plates PP-07 and PP-08 are similar but slightly lower than for PP-06 while the abrasion resistance of both PP-07 and PP-08 is much better. The results show that the balance between the chemical resistance and the abrasion resistance was better for the inventive printing plate PP-08; thus by combining two different (ethylene vinyl) acetal binders defined in the present invention.

The invention claimed is:

1. A positive-working lithographic printing plate precursor comprising:

a support including a hydrophilic surface or a hydrophilic layer; and a heat- and/or light-sensitive coating provided on the support, the coating including a first (ethylene vinyl) acetal copolymer including:

a plurality of ethylenic moieties A having a structure according to the formula:

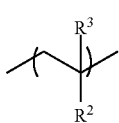

wherein $R^2$ and $R^3$ independently represent hydrogen, a halogen, an optionally substituted linear, branched, or cyclic alk(en)yl group, or an optionally substituted aromatic or heteroaromatic group;

a plurality of acetal moieties B having a structure according to the formula:

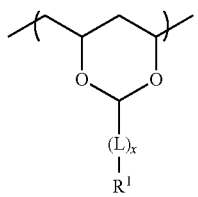

wherein

L is a divalent linking group;

X=0 or 1;

$R^1$ represents an optionally substituted aromatic or heteroaromatic group including at least one hydroxyl group; and the coating includes a second (ethylene vinyl) acetal copolymer, which is different from the first (ethylene vinyl) acetal copolymer, and which includes a plurality of ethylenic moieties A.

2. The printing plate precursor according to claim 1, wherein the second (ethylene vinyl) acetal copolymer further includes a plurality of acetal moieties B and a plurality of acetal moieties F and/or acetal moieties G, which are different from the acetal moieties B, and which include at least one nitrogen atom.

3. The printing plate precursor according to claim 2, wherein the plurality of acetal moieties F and/or acetal moieties G have a structure according to the formulae:

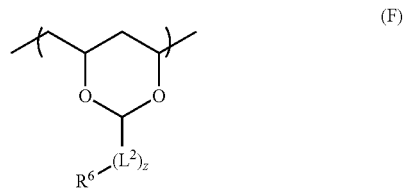

(F)

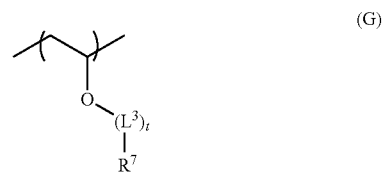

(G)

wherein $L^2$ and $L^3$ independently represent a linking group;

z and t independently represents 0 or 1;

$R^6$ and $R^7$ independently represent an optionally substituted alkyl group, or an optionally substituted aromatic or heteroaromatic group;

in moiety F, at least one of $R^6$ or $L^2$ includes a nitrogen atom; and in moiety G, at least one of $R^7$ or $L^3$ includes a nitrogen atom.

4. The printing plate precursor according to claim 1, wherein the second (ethylene vinyl) acetal copolymer further includes a plurality of the acetal moieties E according to the formula:

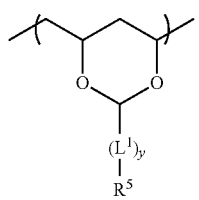

wherein $L^1$ represents a divalent linking group;

y=0 or 1; and $R^5$ represents an aromatic or heteroaromatic group including at least one hydroxyl group and optionally one or more additional substituent(s), and at least one electron withdrawing group in the ortho or the para position relative to the at least one hydroxyl group.

5. The printing plate precursor according to claim 4, wherein the electron withdrawing group has a Hammett $\sigma_p$ value ≥0.30.

6. The printing plate precursor according to claim 1, wherein the second (ethylene vinyl) acetal copolymer further includes a plurality of the acetal moieties B, and a plurality of acetal moieties H and/or acetal moieties I, which include a structural moiety including a chromophoric group having a main absorption in the infrared region.

7. The printing plate precursor according to claim 1, wherein the coating further includes a binder including a sulfonamide group, an imide group, a nitrile group, a urea group, a carboxyl group, a sulfonic acid group, and/or a phosphoric acid group.

8. The printing plate precursor according to claim 1, wherein the coating further includes a phenolic resin selected from a novolac, a resol, or a polyvinylphenolic resin.

9. The printing plate precursor according to claim 1, wherein the coating includes:

a first layer including the second (ethylene vinyl) acetal copolymer; and a second layer, above the first layer, including the first (ethylene vinyl) acetal copolymer.

10. The printing plate precursor according claim 9, wherein the first layer further includes a binder including a sulfonamide group, an imide group, a nitrile group, a urea group, a carboxyl group, a sulfonic acid group, and/or a phosphoric acid group.

* * * * *